United States Patent
Yi et al.

(10) Patent No.: US 10,199,572 B2
(45) Date of Patent: Feb. 5, 2019

(54) INTEGRATED MAGNETIC RANDOM ACCESS MEMORY WITH LOGIC DEVICE

(71) Applicant: GLOBALFOUNDRIES Singapore Pte. Ltd., Singapore (SG)

(72) Inventors: Wanbing Yi, Singapore (SG); Yi Jiang, Singapore (SG); Daxiang Wang, Singapore (SG); Wei Shao, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/164,914

(22) Filed: May 26, 2016

(65) Prior Publication Data

US 2016/0351797 A1 Dec. 1, 2016

Related U.S. Application Data

(60) Provisional application No. 62/166,690, filed on May 27, 2015.

(51) Int. Cl.
*H01L 43/12* (2006.01)
*H01L 27/22* (2006.01)

(52) U.S. Cl.
CPC .......... *H01L 43/12* (2013.01); *H01L 27/228* (2013.01)

(58) Field of Classification Search
None
See application file for complete search history.

(56) References Cited

U.S. PATENT DOCUMENTS

| | | | |
|---|---|---|---|
| 6,232,228 B1 * | 5/2001 | Kwag | C09K 13/04 216/100 |
| 6,611,453 B2 | 8/2003 | Ning | |
| 7,001,783 B2 | 2/2006 | Costrini et al. | |
| 2002/0109172 A1 * | 8/2002 | Okazawa | G11C 11/16 257/298 |
| 2002/0173139 A1 * | 11/2002 | Kweon | H01L 27/11502 438/627 |
| 2003/0002330 A1 * | 1/2003 | Nishimura | B82Y 10/00 365/158 |

(Continued)

OTHER PUBLICATIONS

E. Chen et al., "Advances and Future Prospects of Spin-Transfer Torque Random Access Memory", IEEE Transactions on Magnetics, Jun. 2010, pp. 1873-1878, vol. 46, No. 6, IEEE.

*Primary Examiner* — Tom Thomas
*Assistant Examiner* — Steven B Gauthier
(74) *Attorney, Agent, or Firm* — Horizon IP PTE LTD.

(57) ABSTRACT

Device and methods of forming a device are disclosed. The method includes providing a substrate defined with at least first and second regions. A first dielectric layer is provided over the first and second regions of the substrate. The first dielectric layer corresponds to pre-metal dielectric (PMD) or CA level which comprises a plurality of contact plugs in the first and second regions. A first interlevel dielectric (ILD) layer is provided over the first dielectric layer. The first ILD layer accommodates a plurality of metal lines in M1 metal level in the first and second regions and via contact in V0 via level in the first region. A magnetic random access memory (MRAM) cell is formed in the second region. The MRAM cell includes a magnetic tunnel junction (MTJ) element sandwiched between the M1 metal level and CA level.

18 Claims, 18 Drawing Sheets

(56) References Cited

U.S. PATENT DOCUMENTS

| | | | |
|---|---|---|---|
| 2004/0191928 A1* | 9/2004 | Shi | B82Y 10/00 |
| | | | 438/3 |
| 2005/0242382 A1* | 11/2005 | Daughton | B82Y 10/00 |
| | | | 257/295 |
| 2010/0184239 A1* | 7/2010 | Matsuzaki | H01L 27/228 |
| | | | 438/3 |
| 2012/0135543 A1* | 5/2012 | Shin | H01L 27/228 |
| | | | 438/3 |
| 2012/0314494 A1* | 12/2012 | Shuto | G11C 11/161 |
| | | | 365/171 |
| 2014/0087483 A1 | 3/2014 | Ohsawa et al. | |
| 2015/0311251 A1 | 10/2015 | Yi et al. | |
| 2016/0071905 A1* | 3/2016 | Park | H01L 43/08 |
| | | | 711/104 |

* cited by examiner

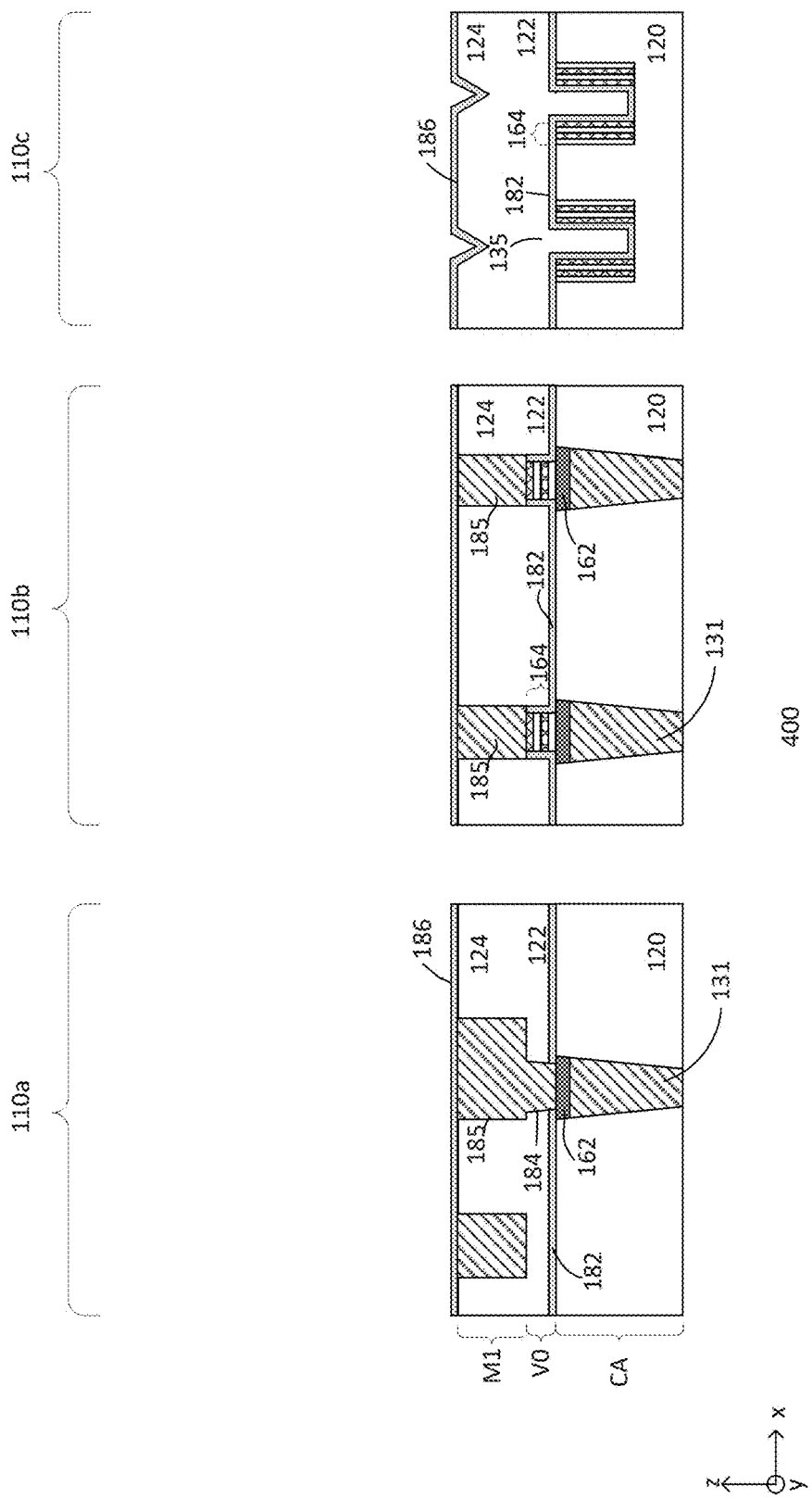

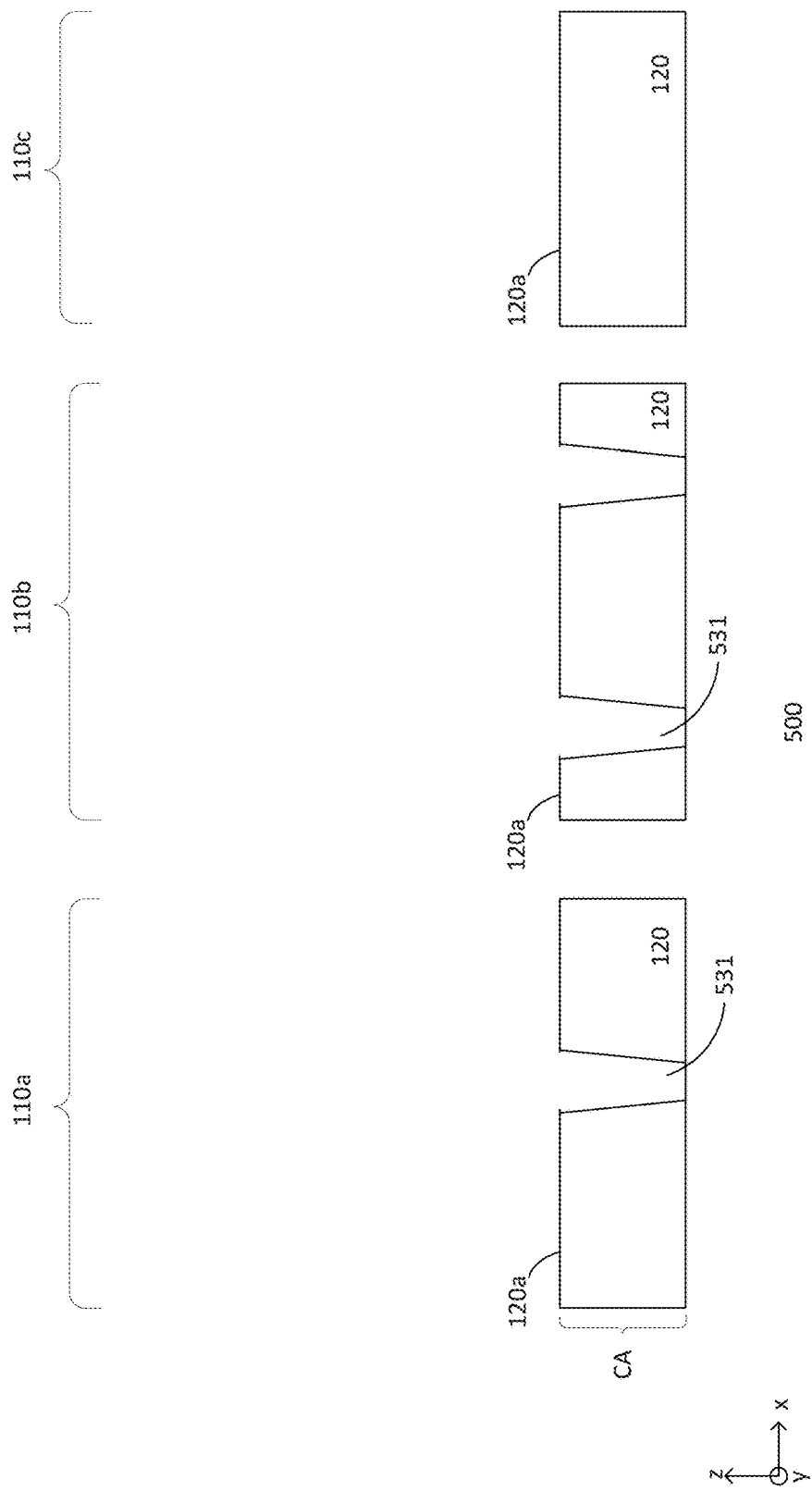

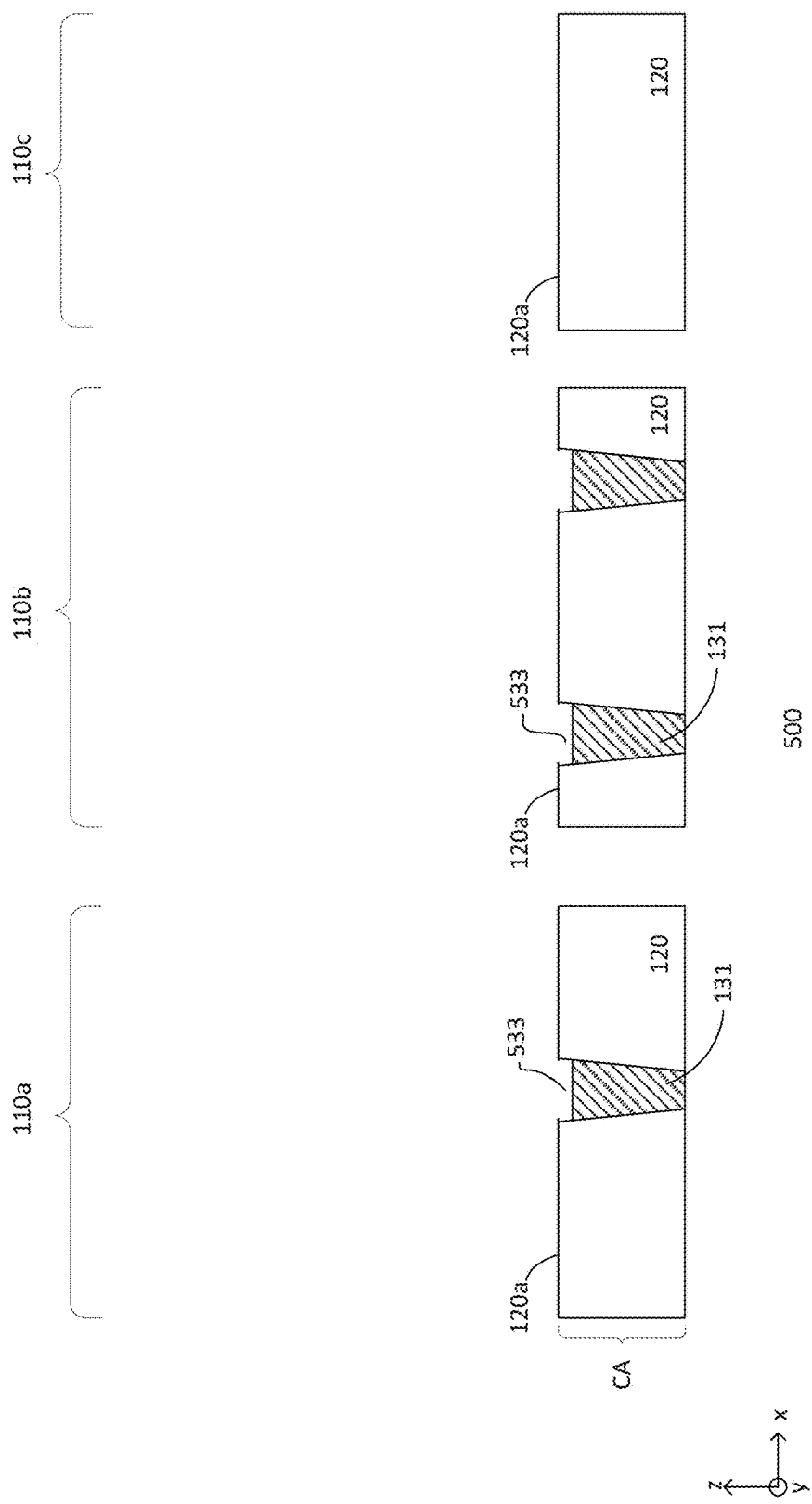

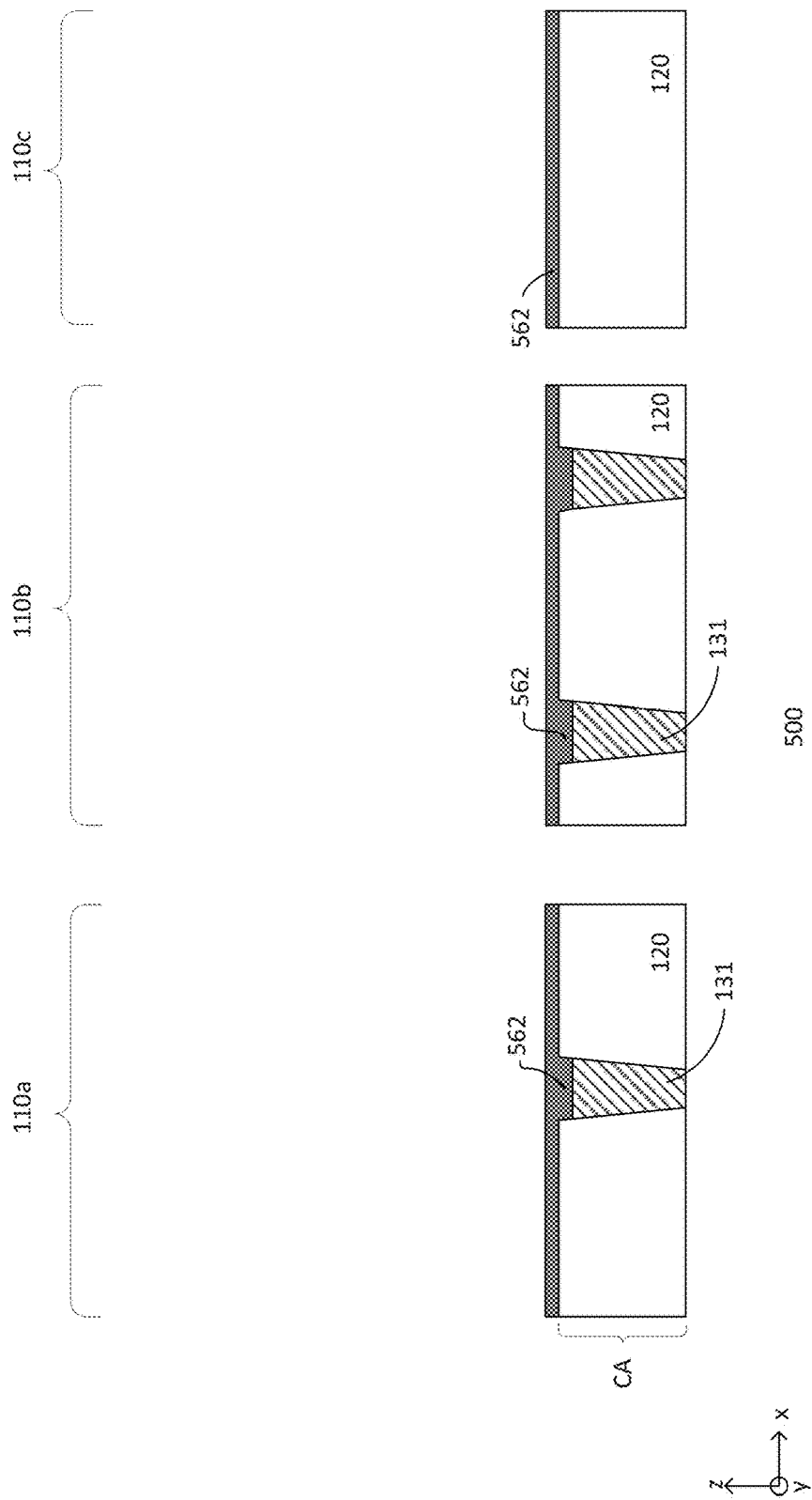

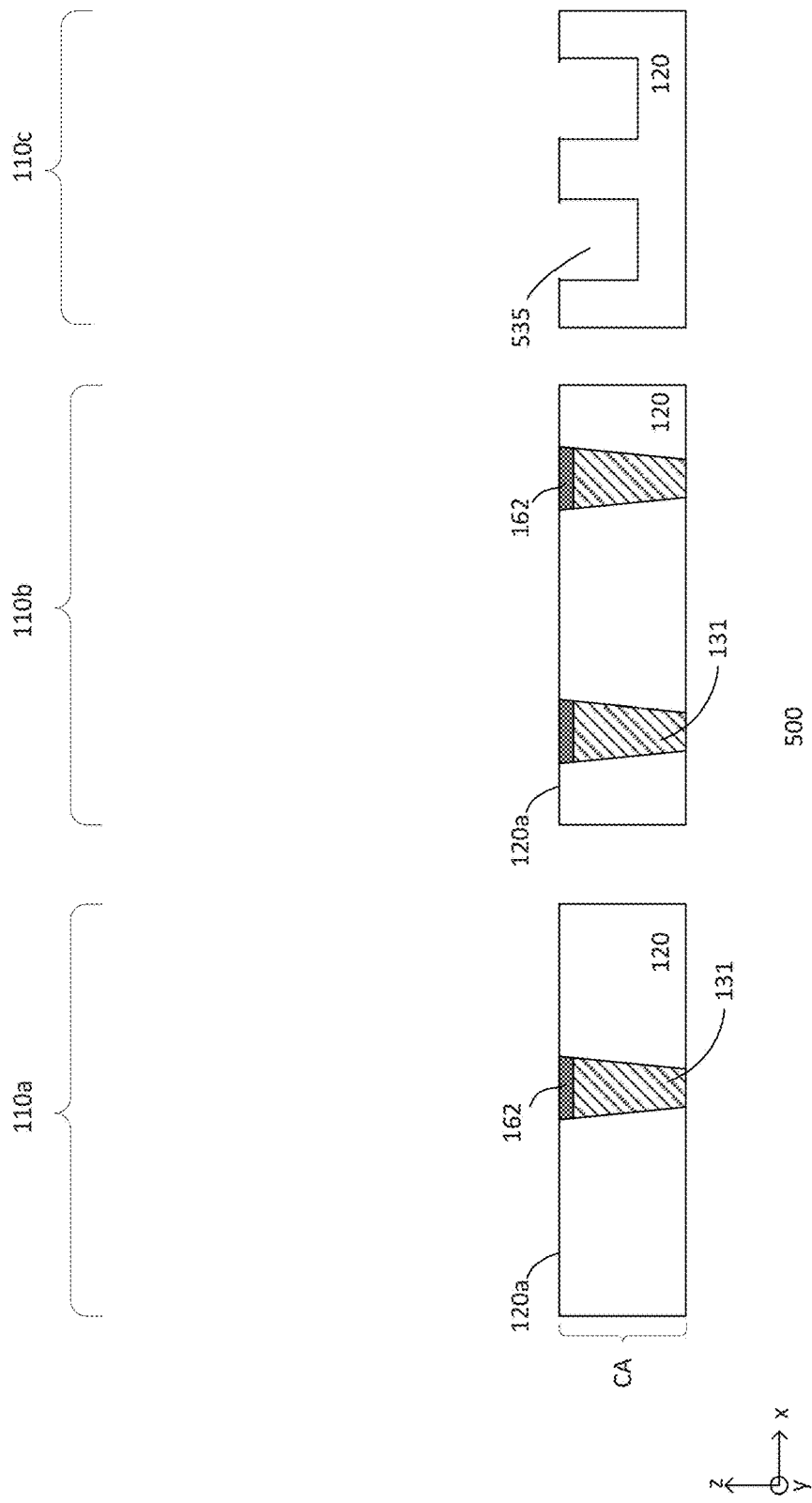

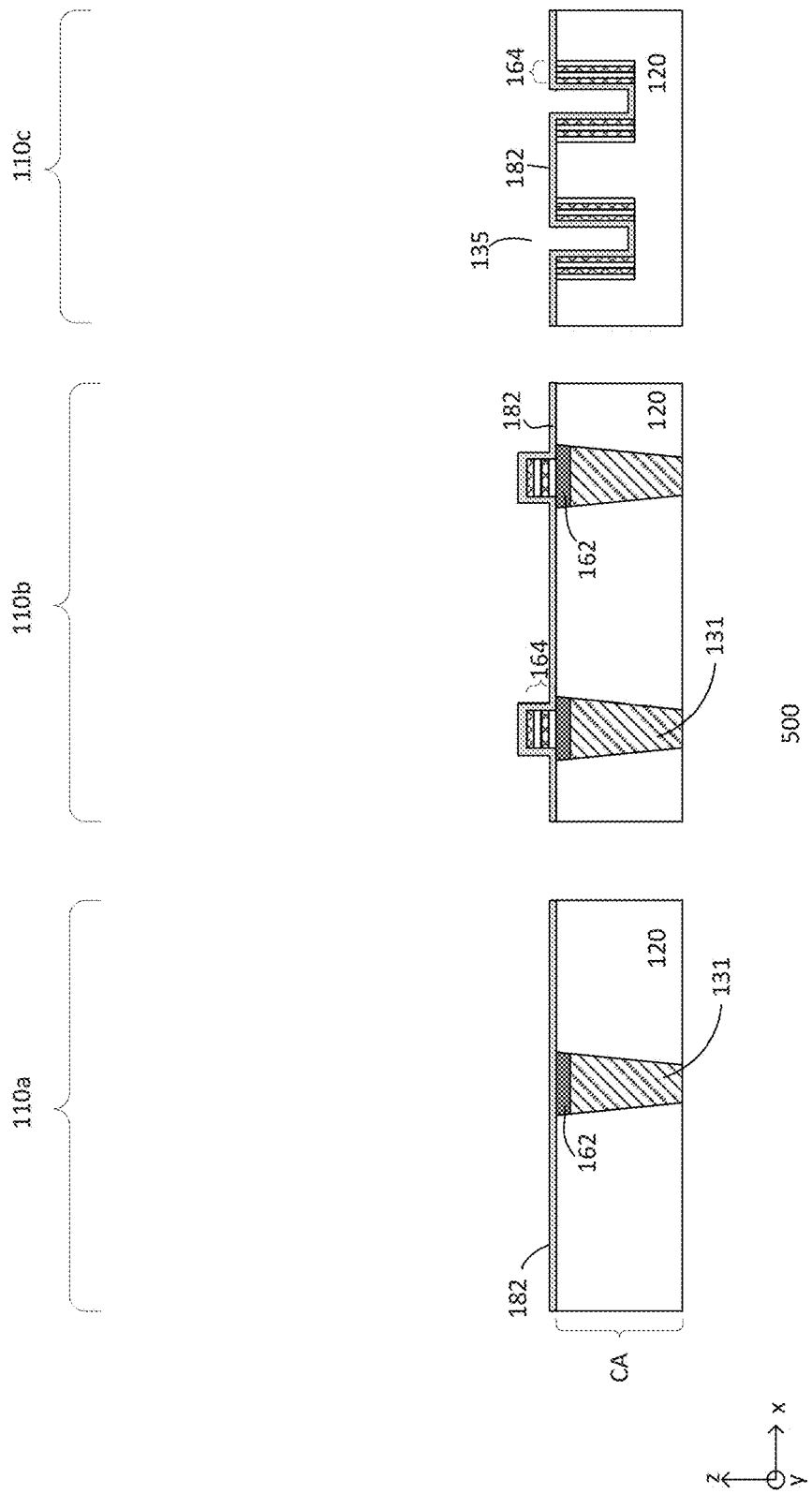

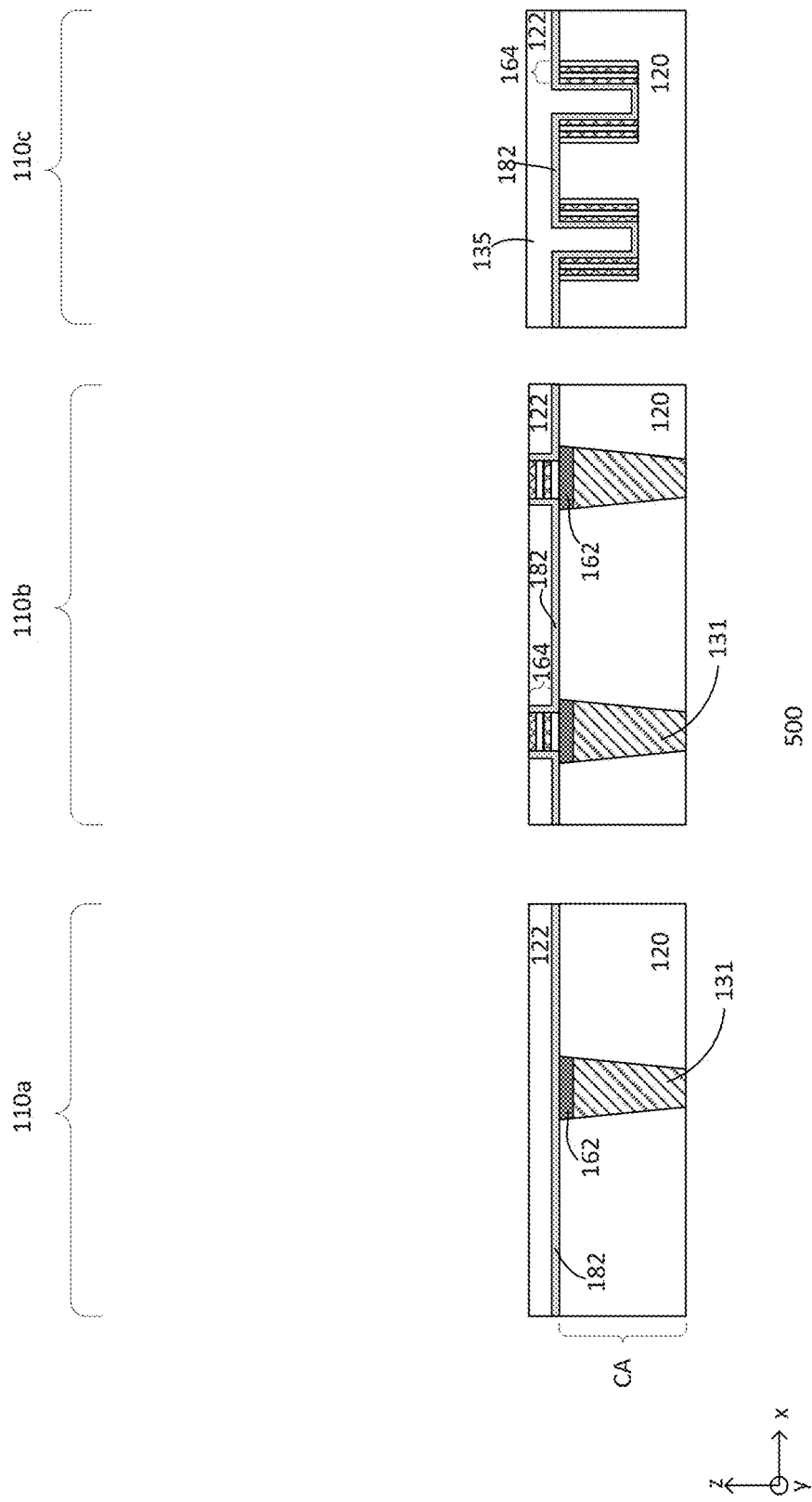

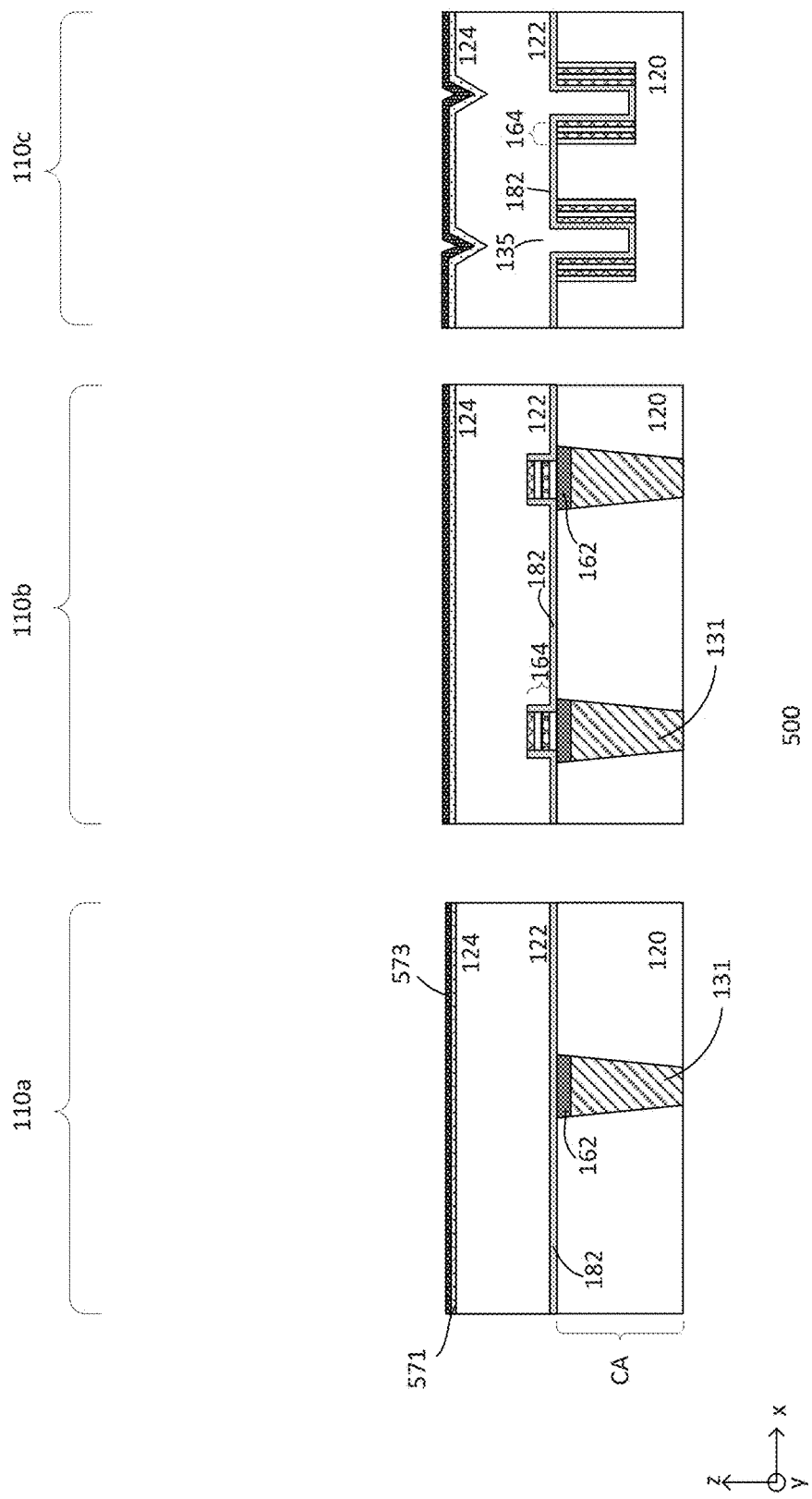

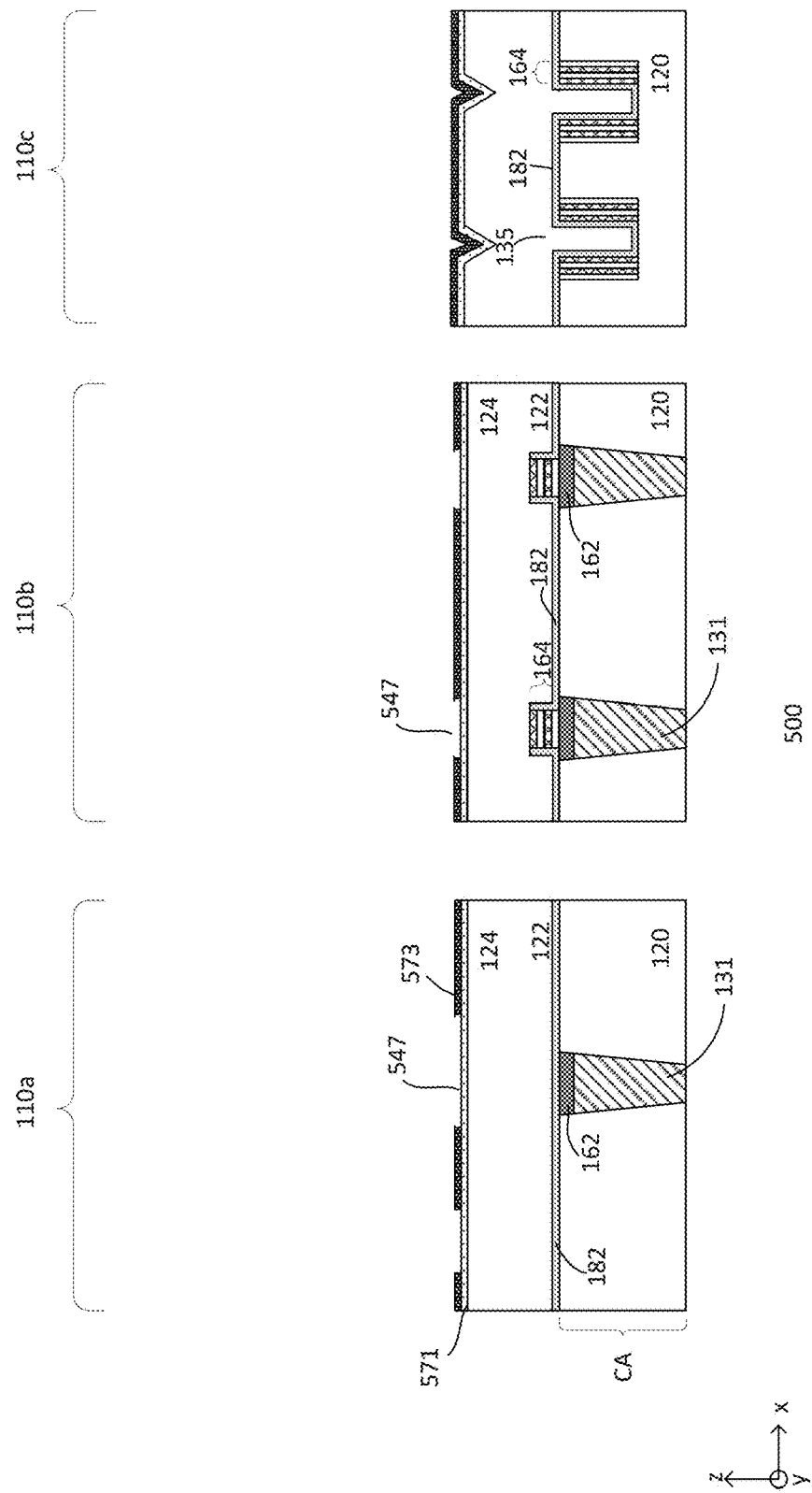

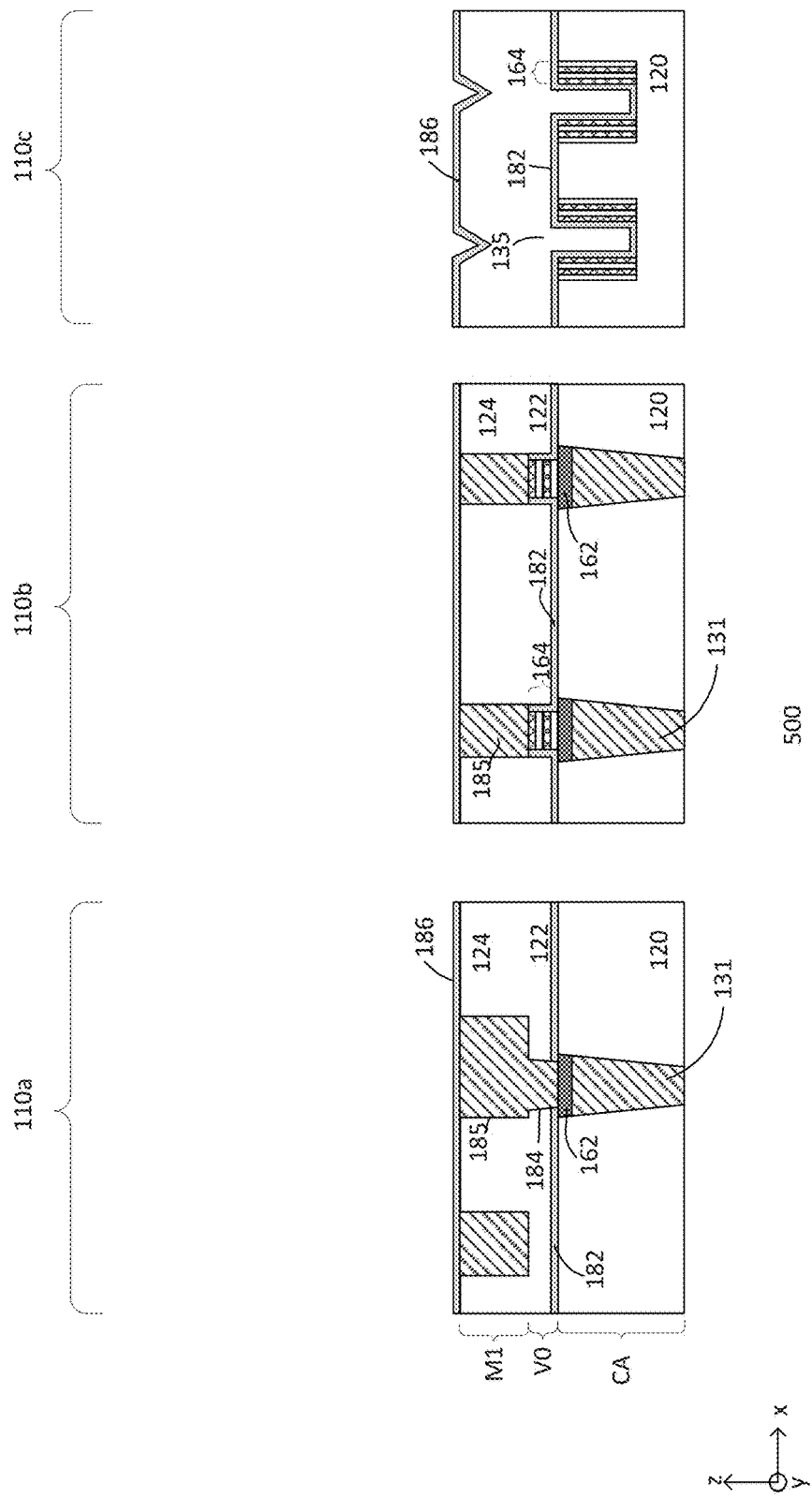

INTEGRATED MAGNETIC RANDOM ACCESS MEMORY WITH LOGIC DEVICE

CROSS-REFERENCE TO RELATED APPLICATION

This application claims the priority benefit of U.S. Provisional Application Ser. No. 62/166,690, filed on May 27, 2015, which is hereby incorporated by reference in its entirety for all purposes.

BACKGROUND

Magnetic random access memory (MRAM) is a non-volatile memory (NVM) which gains popularity in recent years as potential replacement for dynamic random access memory (DRAM), static random access memory (SRAM) and flash. MRAM, for example, includes magnetic tunnel junction (MTJ) element which uses magnetic polarization to store information. MRAM device, for example, includes MTJ stack layers having a plurality of magnetic layers. The MTJ stack layers are generally connected to interconnects in the interlevel dielectric (ILD) layer. The various MTJ stack layers, however, are not transparent to light. Thus, when the various MTJ stack layers are patterned using lithography and etch techniques, the patterned MTJ stack layers may not be aligned to the underlying interconnect structures due to non-transparent metal layers of the MTJ stack and thus fail to couple to the underlying interconnect structures. This may render the MRAM device inoperable.

Furthermore, MRAM cells are commonly integrated with various other logic gates and electronic components such as transistors, capacitors, metal wires, etc., in the development of memory devices. The MTJ stack of the MRAM cells are generally provided in between adjacent metal levels at higher interconnect levels during back-end-of-line (BEOL) processing. However, there is a need to provide MTJ stack at lower interconnect levels for better portability. Accordingly, it is desirable that the process of manufacturing MRAM cell enables MTJ stack to be formed at lower interconnect level and is highly compatible with logic processing. It is also desirable to provide a method that reduces the number of masks involved for integrating MRAM components with logic devices at lower interconnect level into a single chip or IC in a reliable, simplified and cost effective way.

SUMMARY

Embodiments of the present disclosure generally relate to semiconductor device and methods for forming a semiconductor device. In one aspect, a method for forming a device is disclosed. The method includes providing a substrate defined with at least first and second regions. A first dielectric layer is provided over the first and second regions of the substrate. The first dielectric layer corresponds to pre-metal dielectric (PMD) or CA level which comprises a plurality of contact plugs in the first and second regions. A first interlevel dielectric (ILD) layer is provided over the first dielectric layer. The first ILD layer accommodates a plurality of metal lines in M1 metal level in the first and second regions and via contact in V0 via level in the first region. A magnetic random access memory (MRAM) cell is formed in the second region. The MRAM cell includes a magnetic tunnel junction (MTJ) element sandwiched between the M1 metal level and CA level.

In another aspect, a device is presented. The device includes a substrate defined with at least first and second regions. A first dielectric layer is disposed over the first and second regions of the substrate. The first dielectric layer corresponds to pre-metal dielectric (PMD) or CA level which includes a plurality of contact plugs in the first and second regions. A first interlevel dielectric (ILD) layer is disposed over the first dielectric layer. The first ILD layer accommodates a plurality of metal lines in M1 metal level in the first and second regions and via contact in V0 via level in the first region. A magnetic random access memory (MRAM) cell is disposed in the second region. The MRAM cell includes a magnetic tunnel junction (MTJ) element sandwiched between the M1 metal level and CA level.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which:

FIG. 4a shows cross-sectional views of logic and memory regions of an embodiment of a device and FIG. 4b shows enlarged cross-sectional views of logic and memory portions and scribe region of the device; and FIGS. 5a-5m show cross-sectional views of an embodiment of a process for forming a device.

DETAILED DESCRIPTION

Embodiments of the present disclosure generally relate to integration of memory device with logic device in an integrated circuit (IC) with reduced number of masks. The memory device, for example; may be spin transfer torque-magnetic random access memory (STT-MRAM) device. The memory device includes memory cell having a magnetic storage element, such as a magnetic tunnel junction (MTJ) element. Other suitable types of memory devices may also be useful. The MTJ element, in one embodiment, is disposed or provided at lower interconnect level during back-end-of-line (BEOL) processing. For instance, the MTJ element is provided in between pre-metal dielectric (PMD or CA) level and first metal line (M1) level. Such memory device together with logic components are generally based on any suitable technology node (including but not limited to 20 nm technology node and below). The memory device together with the logic components can be incorporated into standalone memory devices including, but not limited to, USB or other types of portable storage units, or ICs, such as microcontrollers or system on chips (SoCs). The devices or ICs may be incorporated into or used with, for example, consumer electronic products, or relate to other types of devices.

Figure 1:
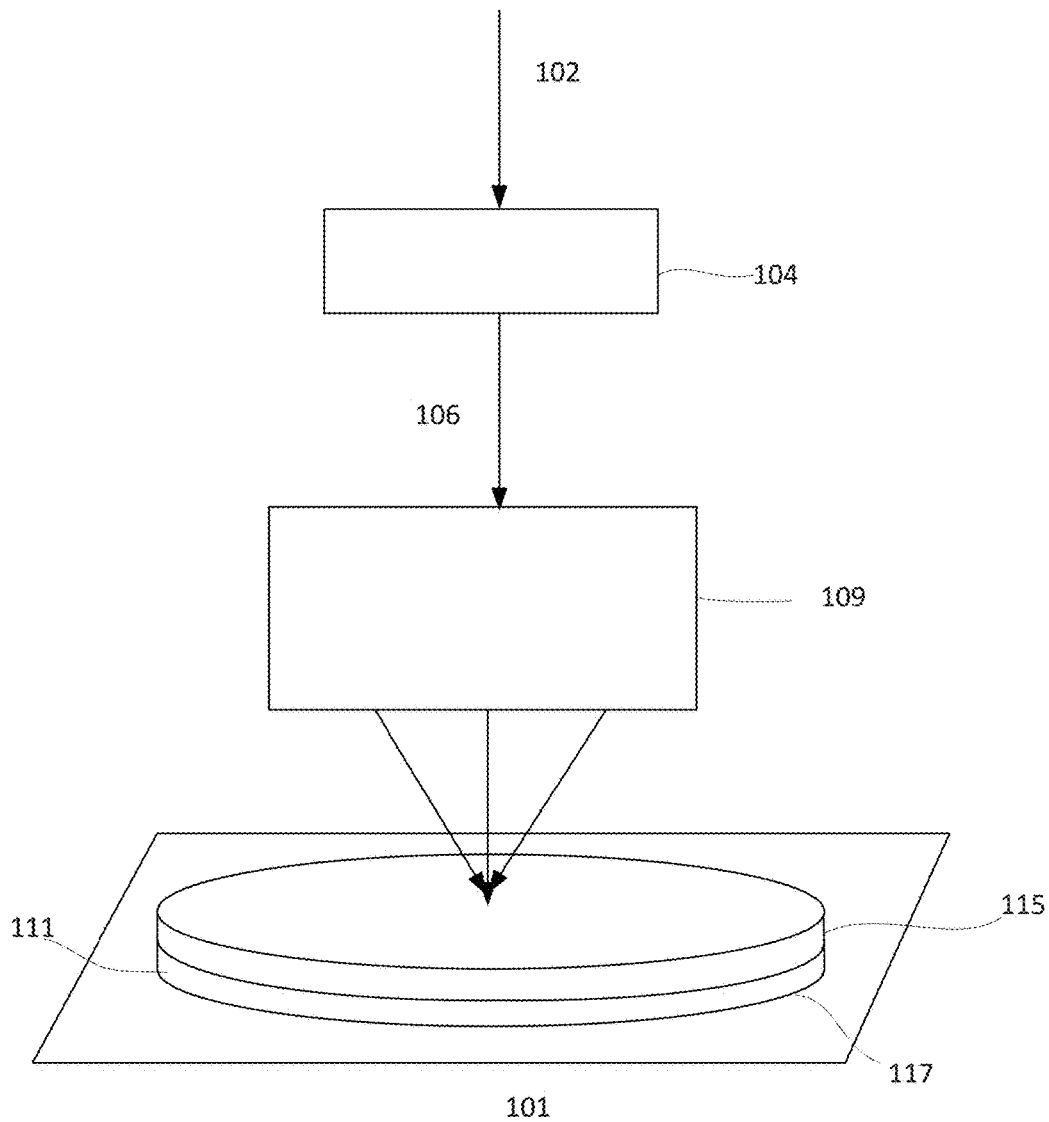
FIG. 1 shows a simplified diagram of a portion of an exemplary lithography system.

FIG. 1 shows a simplified portion of an exemplary photolithography system 101 used for patterning a wafer to form features, such as circuit components. The photolithography system may include, for example, exposure, beam shaping and illumination sub-systems (not shown). The exposure sub-system, for example, includes an exposure source for generating electromagnetic radiation EMR). In one embodiment, the EMR is used in extreme ultra-violet (EUV) lithography. The EMR is passed through the beam shaping sub-system, which may include a collimator and monochromator to prepare an EMR beam EMR operating beam). The EMIR operating beam is passed through the illumination sub-system. The illumination sub-system, for example, may include mirrors and/or lenses. The illumination sub-system conducts the EMR operating beam 102 to a mask or reticle 104 having a desired pattern (e.g., mask pattern).

In one embodiment, the reticle is a transmissive reticle. For example, the reticle transmits the EMR operating beam through it. The transmitted EMR beam 106 is a patterned beam having the pattern of the reticle. Other types of reticles, such as reflective reticles, can also be employed. For example, the reflective reticle reflects the EMR operating beam, creating a reflected patterned beam.

The patterned beam is projected onto the wafer 111. In one embodiment, the wafer is disposed on a translation stage 117. In one embodiment, the patterned beam is projected onto the wafer by a projection sub-system 109. The projection sub-system may include mirrors and/or lenses for projecting the patterned beam onto a portion of the wafer. The water includes a photoresist layer 115 which is exposed by the patterned beam. For example, the image of the patterned beam is imaged onto the photoresist layer. The patterned beam exposes a portion of the wafer with the image of the reticle. The exposed portion corresponds to a device region on which a device is formed. After exposing the portion, the stage may be translated to expose a next portion of the wafer. The exposure process repeats until the complete wafer is exposed. Processing a wafer using other types of lithographic or printing systems may also be useful.

After the wafer has been exposed, the photoresist is developed, transferring the pattern of the reticle to the resist layer. An anti-reflective coating (ARC) may be provided beneath the resist layer to improve lithographic resolution. The patterned resist layer serves as an etch mask. For example, an anisotropic etch, such as a reactive ion etch (RIE), patterns the wafer using the etch mask. Depending on the stage of process, the etch may etch a bare wafer, a layer on the wafer, or multiple layers on the wafer.

After processing of the wafer is completed, the wafer is diced along the scribe lane or dicing channel to produce individual dies. The dies may be processed to include package bumps. For example, wafer level packaging may be performed prior to dicing the wafer. The dies may be packaged and mounted onto an external component, such as a package substrate or a circuit board.

Figure 2:
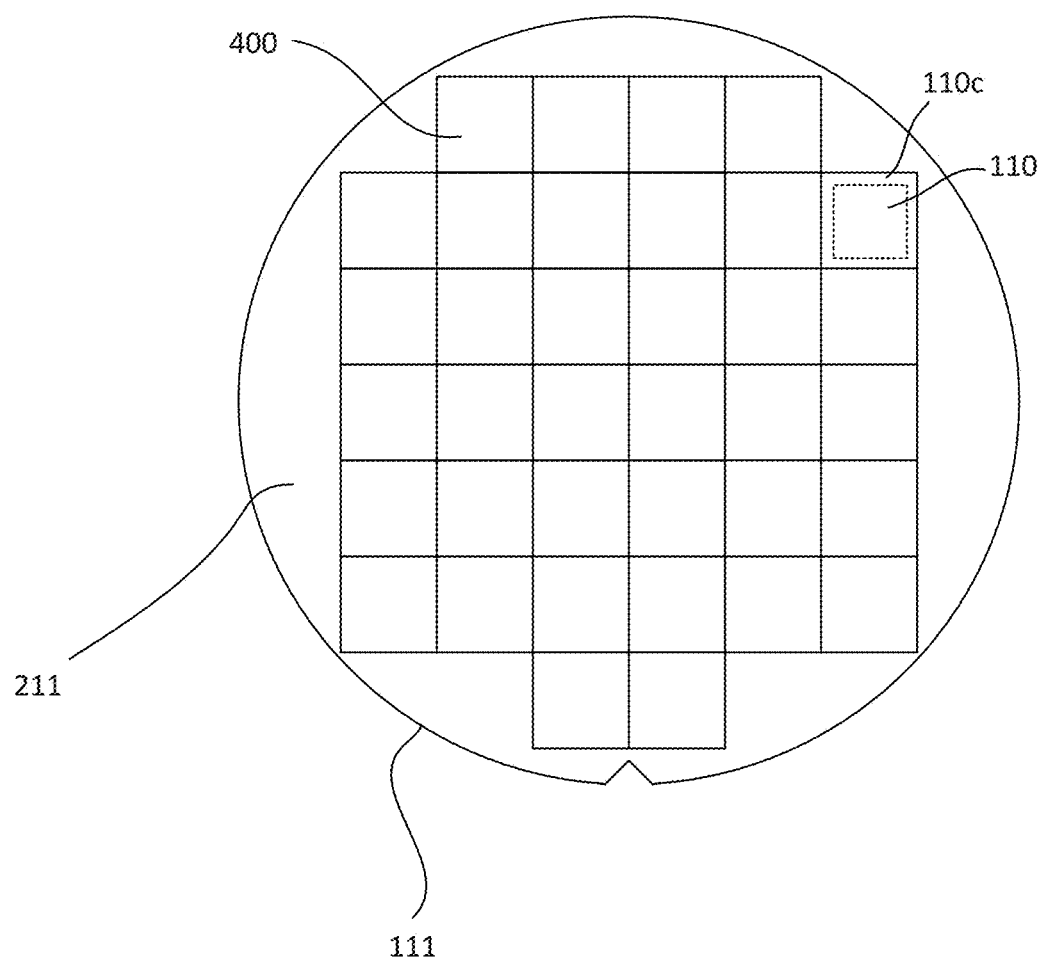
FIG. 2 shows a simplified plan view of a portion of an embodiment of a semi conductor wafer.

FIG. 2 shows a simplified plan view of a portion of an embodiment of a semiconductor wafer 111. The semiconductor water, for example, may be a silicon water. Other types of wafers are also useful. For example, the wafer may be a p-type or n-type doped wafer.

The wafer includes a surface 211 on which a plurality of devices 400 are formed. The device 400, in one embodiment, includes a MRAM device as will be described in detail in FIGS. 4a-4b and FIGS. 5a-5m later. The plurality of devices may be formed on the wafer in parallel. The devices, for example, are arranged in rows along a first (x) direction and columns along a second (y) direction. A device, as shown, includes a main device region 110 and a frame or perimeter region 110c. The main device region includes features and interconnections of the die. As for the perimeter region, it surrounds the main device region. The perimeter region, for example, serves as the scribe lanes or dicing channels 110c on the wafer, separating adjacent devices. The devices are singulated by dicing the wafer along the scribe lanes or dicing channels.

Figure 3:
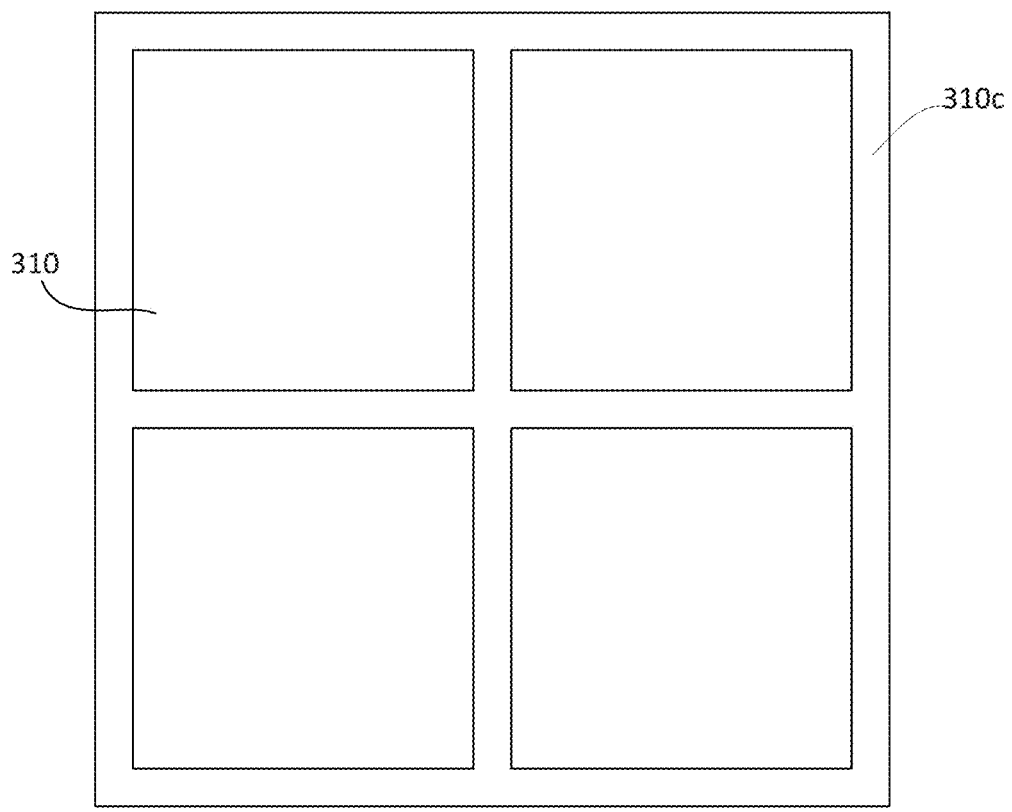
FIG. 3 shows a simplified plan view of an embodiment of a portion of a reticle used in exposing a wafer.

FIG. 3 shows an embodiment of a portion of the reticle 104 used in exposing the wafer 111. As shown, the reticle includes prime or main regions 310. The main region, for example, may be referred to as the device region. The device region includes a pattern which, for example, corresponds to the pattern to be formed in the device. The reticle creates patterns of devices in the main device regions on the wafer. A frame region 310c surrounds the device region. The frame region, for example, corresponds to perimeter regions or scribe lanes on the wafer. The frame region surrounds the devices on the wafer. The reticle is used to create desired patterns for respective levels on the device. In forming the dies, several reticles may be employed.

FIG. 1a shows cross-sectional views of first region 110a, second region 110b and third region 110c of an embodiment of a device 400. FIG. 4b shows enlarged cross-sectional views of lower interconnect level of the first, second and third regions of the device 400. The first region 110a may be referred to as the logic region, the second region 110b may be referred to as the memory region and the third region 110c may be referred to as the scribe lane/region or dicing channel. The cross-sectional view, for example, s along a bitline (or x) direction of the device. The device 400, as shown, includes one or more memory cells having a cell selector unit or transistor and one or more logic transistors. The memory cell, for example, may be a non-volatile memory (NVM) cell. The memory cell, in one embodiment, is a magnetoresistive cell, such as a STT-MRAM cell.

The cell select unit of the memory cell and the logic transistor of the logic component are disposed on a substrate 105. For example, one or more logic transistors 116 are disposed in the first (or logic) region 110a and one or more memory cell selector units or transistors 118 are disposed in the second (or memory) region 110b of the same substrate 105. The second region 110b is a memory cell region which may be part of an array region. For example, the array region may include a plurality of cell regions. The substrate may also include other types of device regions (not shown) for accommodating other types of components.

The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a bulk crystalline by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Front-end-of-line (FEOL) processing is performed on the substrate. The FEOL process, for example, forms n-type and p-type devices or transistors in the logic region 110a, the memory cell region 110b as well as other regions on the substrate. The p-type and n-type device form a complementary MOS (CMOS) device. The FEOL processing, for example, includes forming isolation regions, various device and isolation wells, transistor gates and transistor source/drain (S/D) regions and contact or diffusion regions serving as substrate or well taps. Forming other components with the FEOL process may also be useful.

As shown, the FEOL processing forms at least a logic region 110a and a memory cell region 110b isolated by isolation regions 108, such as shallow trench isolation (SIT) regions. The memory cell region, as shown, is part of an array region for accommodating a plurality of memory cells. Isolation regions may be provided to isolate columns of memory cells. Other configurations of isolation regions may also be useful. The first region 110a may include a logic device well (not shown) while the second region 110b may include a cell device well. The cell device well, for example, serves as a body well for a cell select transistor 118 of the memory cell while the logic device well, for example, serves as a body well for the logic transistor. The device wells may be doped with second polarity type dopants for first polarity type transistors. The device wells may be lightly or intermediately doped with second polarity type dopants. In some cases, a device isolation well (not shown) may be provided, encompassing the device well. The isolation well may have a dopant type which has the opposite polarity to that of the device well. For example, the isolation well may include first polarity type dopants. The isolation well serves to isolate the device well from the substrate. Well biases may be provided to bias the wells.

For simplicity and illustration purpose, the first region includes a logic transistor 116 while the second region includes one or more cell selector units 118. The cell selector unit includes a selector for selecting the memory cell. The selector, for example, may be a select transistor. In one embodiment, the select and logic transistors are metal oxide semiconductor (MOS) transistors. Thus, the FEOL processing forms the logic transistor in the first region and the cell selector transistor in the second region. The transistors, as shown, include first and second source/drain (S/D) regions 114 formed in the substrate and a gate 112 disposed on the substrate between the S/D regions. The S/D regions, for example, are heavily doped regions with first polarity type dopants, defining the first type transistor. For example, in the case of a n-type transistor, the S/D regions are n-type heavily doped regions. Alternatively, in the case of a p-type transistor, the S/D regions are p-type heavily doped regions. Other types of transistors or selectors may also be useful. As for the gate, it includes a gate electrode over a gate dielectric. The gate electrode may be polysilicon while the gate dielectric may be silicon oxide. Other types of gate electrode and gate dielectric materials may also be useful. A gate, for example, may be a gate conductor along a wordline (or y) direction. The gate conductor forms a common gate for a row of cells.

A S/D region 114 may include LDD and halo regions (not shown). Dielectric spacers (not shown) may be provided on the gate sidewalls of the transistor to facilitate forming transistor halo, LDD and transistor S/D regions. It is understood that not all transistors include LDD and/or halo regions.

After forming the logic transistor in the first region and cell selector unit in the second region and other transistors (not shown) in other device regions, back-end-of-line (BEOL) processing is performed. The BEOL process includes forming interconnects in interlevel dielectric (ILD) layers. The interconnects connect the various components of the IC to perform the desired functions. An ILD level includes a metal level and a contact level. Generally, the metal level includes conductors or metal lines while the contact level includes via contacts. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

A device may include a plurality of ILD layers or levels. For example, x number of ILD levels may be provided. As illustrated, the device includes 4 ILD levels (x=4). Other suitable number of ILD levels may also be useful. The number of ILD levels may depend on, for example, design requirements or the logic process involved. A metal level of an ILD level may be referred to as $M_i$, where i is from 1 to x and is the $i^{th}$ ILD level of x ILD levels. A contact level of an ILD level may be referred to as $V_{i-1}$, where i is the $i^{th}$ ILD level of x ILD levels.

The BEOL process, for example, commences by forming a dielectric layer 120 over the transistors and other components formed in the FEOL process. The dielectric layer may be silicon oxide. For example, the dielectric layer may be silicon oxide formed by chemical vapor deposition (CVD). The dielectric layer serves as a pre-metal dielectric layer of the BEOL process. The dielectric layer may be referred to as PMD or CA level of the BEOL process. Contact plugs 131 are formed in the CA level dielectric layer 120. The contact plugs may be formed by a single damascene process. Via openings are formed in the dielectric layer using mask and etch techniques. For example, a patterned resist mask with openings corresponding to the vias or via openings is formed over the dielectric layer. An anisotropic etch, such as RIE, is performed to form the vias, exposing contact regions below, such as S/D regions and gates. A conductive layer, such as tungsten, is deposited on the substrate, filling the openings. The conductive layer may be formed by sputtering. Other techniques may also be useful. A planarization process, such as chemical mechanical polishing (CMP), is performed to remove excess conductive material, leaving contact plugs 131 in the CA level.

The contact plugs 131 may serve as S/D contacts or gate contacts (not shown). As shown. S/D contacts 131 are disposed in the CA level. The S/D contacts are coupled to the first and second S/D regions 114 of the transistors in the first and second regions. Other S/D contacts coupled to other S/D regions of transistors may also be provided. The CA level may include a gate contact (not shown) coupled to the gate of the transistor. The gate contact may be disposed in another cross-section of the device. Other S/D and gate contacts for other transistors may also be provided.

After forming contacts in the CA level, the BEOL process continues to form dielectric layer over the substrate, covering the CA level dielectric layer. The dielectric layer, for example, may be referred to as a first ILD layer or level and may be a dielectric layer stack having two dielectric layers 122 and 124. The dielectric stack may also include other suitable number of dielectric layers. The first ILD layer, for example, is formed of a low-k dielectric material. Preferably, the first ILD layer is an ultra low-k dielectric layer, such as SiCOH. Other suitable types of low-k dielectric materials may also be useful. The dielectric layer may be formed by CVD. Other suitable techniques for forming the first ILD layer may also be useful.

Conductive lines 185 are formed in the first metal level (M1) while via contacts 184 are formed in the first via level (V0) of the first ILD level. Thus, the first ILD level, in one embodiment, accommodates M1 and V0 levels. The conductive lines and via contacts may be formed by dual-damascene technique. For example, the dielectric layer may be etched to form trenches and via openings using, for example, mask and etch techniques. A conductive layer is formed on the substrate, filling the trenches and openings. For example, a copper or copper alloy layer may be formed to fill the trenches and openings simultaneously. The conductive material may be formed by, for example, plating, such as electro or electroless plating. Other types of conductive layers or forming techniques may also be useful. Excess conductive materials are removed by, for example, CMP, leaving planar surface with the conductive line and first ILD layer. The first metal level M1, first via level V0 and pre-metal dielectric CA level may be referred as a lower ILD or lower interconnect level.

The process continues to form additional or upper ILD layers/levels. The additional levels may include ILD level 2 to ILD level x. For example, in the case where x=4 (4 levels), the upper ILD level includes ILD levels from to 4, which includes metal levels M2 to M4 and via levels V1 to V3. Designating other ILD levels as upper ILD level may also be useful. The number of ILD levels may depend on, for example, design requirements or the logic process involved. The ILD layers, in one embodiment, are formed of low-k dielectric materials, such as SiCOH. Other suitable types of low-k dielectric materials may also be useful. The ILD layers may be formed by, for example, CVD. Other techniques for forming the ILD layers may also be useful.

The conductors and contacts of the additional ILD layers may be formed by dual damascene technique. For example, via openings and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed by, for example, CMP, forming conductors and contacts in an ILD layer.

The uppermost ILD level (e.g., M4) may have different design rules, such as critical dimension (CD), than the lower ILD levels. For example. Mx may have a larger CD than metal levels M1 to Mx-1 below. By way of example only, and without limitation, the uppermost metal level may have a CD which is 2× or 4× the CD of the metal levels below.

A dielectric liner (e.g., layers 182 and 186) may be disposed between ILD levels and on the substrate. The dielectric liner, for example, serves as an etch stop layer. The dielectric liner may be formed of a low k dielectric material. For example, the dielectric liner may be nBLOK. Other types of dielectric materials for the dielectric liner may also be useful.

Figure 4A:
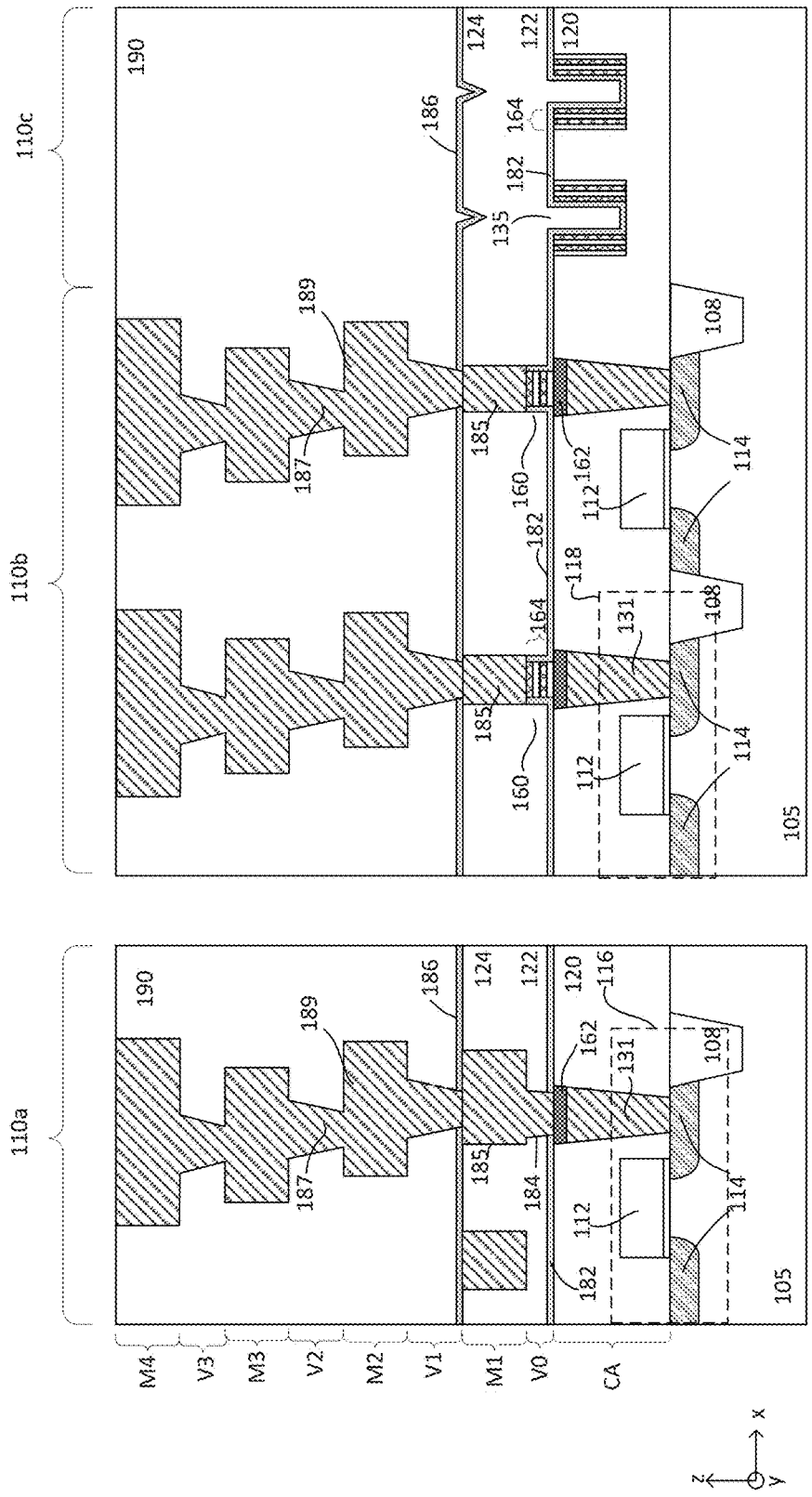

As described, the first region 110a accommodates a logic component and the second region 110b accommodates one or more MRAM cells as shown in FIG. 4a. In one embodiment, the MRAM cell includes a storage or memory element 160 which is disposed in lower interconnect level in the second region 110b of the device. In one embodiment, the storage element is formed in between adjacent lower ILD levels, such as in between CA and M1 levels. For example, the storage element is disposed in V0 level of the first ILD level as shown in FIG. 4a.

For simplicity and illustration purposes, the enlarged cross-sectional views of the logic and memory portions of the device shown in FIG. 4b show portions of the dielectric layers which correspond to CA, V0 and M1 levels with the substrate, gates and S/D regions of the transistors omitted. For the sake of simplicity, the dielectric layer 120 may be referred to as a CA dielectric layer and its contact plugs 131 may be referred to as pre-metal contact plugs. As for the dielectric layer above the dielectric layer 120 shown in the first and second regions, metal lines 185 are disposed in the metal level (e.g., M1) of the first ILD level in the first and second regions and via contact 184 is disposed in the via level (e.g., V0) of the first ILD level in the first region. The contact plug 131 in the first region may be coupled to first S/D region of the logic transistor 116 while the contact plugs 131 in the second region are coupled to a MTJ element 160 of the MRAM cell which will be described later. The contact plugs 131 in the second region, for example, may be used for connection purpose and couples the MTJ element to the first S/D region 114 of the select transistor 118. Although one or two metal lines and via contacts are shown in the first and second regions, it is understood that there could be other suitable number of via contacts and metal lines in the same dielectric level of the first and second regions.

The via contact 184 and metal lines 185 in the first ILD level include a conductive material. The conductive material, for example, includes copper (Cu). Other suitable types of conductive material may also be useful. The dimensions of this metal line 135a and its underlying via contact 184, for example, are defined at the minimum line resolution of the lithography and etch capability for a technology process node, which may be referred to as 1× design rule. The thickness of the metal lines 185 with reference to the top surface of the first ILD level, for example, is about 70 nm while the thickness of the via contact 184, for example, is about 50 nm. Other suitable thickness dimensions may also be useful, depending on the design requirements of a technology node.

The CA dielectric layer 120, in one embodiment, includes via openings in the first and second regions 110a-110b and one or more trenches in the third region 110c. The via openings in the first and second regions, for example, accommodate the contact plugs 131 as described above and a bottom electrode 162 as will be described later while the one or more trenches correspond to an alignment trench 135 that is disposed in the scribe region or scribed lane 110c adjacent to the memory region. The via openings, for example, extends from the top surface of the CA dielectric layer to the top surface of the substrate while the alignment trench extends from the top surface of the CA dielectric layer and extends partially into the CA dielectric layer 120. During processing, the alignment trench 135, for example, provides topographic feature which is used to align subsequently deposited memory or magnetic stack layers and subsequent formed layers of the storage or MTJ element of the MRAM cell. The topographic feature is also used as an alignment mark for patterning the magnetic stack layers such that the patterned layers are aligned and coupled to the underlying bottom electrode which will be described in FIGS. 5a-5m later.

In the second region 110b, a storage element 160 of the MRAM cell is disposed over the CA dielectric layer. In one embodiment, the MRAM cell is a STT-MRAM cell and the storage element includes a magnetic tunnel junction (MTJ) element. Other suitable types of storage elements or memory cells may also be useful.

In one embodiment, the storage element includes a first electrode. The first electrode, for example, may be a bottom electrode 162. In some embodiments, the storage element may further include a second electrode, which may be a top electrode. Other configurations of electrodes may also be useful. As described, the bottom electrode 162 of the memory element is disposed in the via opening which accommodates the contact plug 131 and is connected to the first S/D region 114 of the logic and select transistors. The bottom electrode 162, in one embodiment, includes a top surface that is substantially planar with a top surface of the CA dielectric layer 120. In one embodiment, the bottom electrodes are directly coupled to the contact plugs 131 in the first and second regions.

The storage element 160 includes a MTJ stack 164 disposed in between the metal line 185 and the bottom electrode 162 in the second region. The storage element, for example, may include a bottom-pinned MTJ element or a top-pinned MTJ element. The bottom-pinned MTJ element is formed by having the magnetically fixed layer disposed below the magnetically free layer while the top pinned MTJ element is formed by having the fixed layer disposed above the free layer. For illustration purpose, the MTJ stack includes four layers. It is understood that the MTJ stack may include other suitable number of layers. The stack generally includes a magnetically fixed (pinned) layer, one or more tunneling barrier layers and a magnetically free layer. The fixed layer includes a magnetic layer and a pinning layer. The pinning layer, for example, pins the magnetization direction of the magnetic layer, forming a pinned layer. The bottom most layer of the MTJ stack is coupled to the bottom electrode while the top most layer of the MTJ element is coupled to the metal line 185 in the second region. The metal line 185 in the second region, for example, may serve as a bitline (BL). Providing the bitline at other metal level may also be useful.

By way of example, the free layer and the fixed layer may be CoFeB or CoFe based composite material and the tunneling barrier layer may be MgO or $Al_2O_3$. As for the pinning layer, it may be PtMn or IrMn. The bottom electrode may be Ti, TiN, Ta, TaN or other suitable metals used in the semiconductor process. Other suitable configurations or materials of storage or memory element may also be useful.

Generally, the upper layers of the MTJ stack of the memory cell, for example, have sidewalls that are aligned with each other and include a length dimension which is smaller than a length dimension of the lower layers of the MTJ stack in the x-direction. For example, the fixed layer and the lower tunnel barrier of the MTJ stack in the second region as defined includes a length which is greater than the length of the free layer and upper tunnel barrier of the MTJ stack 164 in the x direction such that it is easy for etch process control and to prevent electrical shorts between the upper MTJ portion and the bottom electrode as well as to prevent electrical shorts between the free and fixed layers of the MTJ stack because of less re-deposition. For simplicity purpose, such configuration is not illustrated in detail this disclosure.

In one embodiment, an encapsulation liner 182 may line exposed top surface of the CA dielectric layer 120 in the first, second and third regions. The encapsulation liner, as shown, also lines exposed side surfaces of the MTJ stack 164 in the second region, as shown in FIG. 4b. Thus, the encapsulation liner serves as a protection liner as well as an etch stop layer. The encapsulation liner may be a low k dielectric liner. For example, the dielectric liner may be nBLOK. Other suitable types of dielectric materials for the encapsulation liner may also be useful.

As shown in the second region, metal lines 185 which may serve as bitlines are disposed over and electrically connected to the MTJ elements 160 which are in communication with S/D contacts 131 that are coupled to the first S/D regions 114 of the select transistors 118. As for the second S/D regions 114 of the select transistors, they may be coupled to a source line (SL) which may be provided in any suitable metal level through S/D contacts (not shown). A gate contact (not shown) may be coupled to the gate 112 of the select transistor 118. The gate contact may be coupled to a wordline (WL) which may be provided by the gate or provided in any suitable metal level.

As for the third region 110c, the alignment trench 135 is partially filled with the various layers of the MTJ stack which includes a topographic feature to serve as an alignment mark for patterning and defining the MTJ stack of the storage element. For example, the various layers of the MTJ stack are disposed on sidewalls of the alignment trench while the encapsulation liner 182 lines the sides and bottom of the alignment trench.

A dielectric layer 190 is disposed over the first ILD layer with a dielectric liner 186 disposed therebetween. The dielectric liner 186, for example, covers the metal lines 185 in M1 level and serves as an etch stop layer. The dielectric liner 186, for example, may include the same dielectric material as the encapsulation liner 182. The dielectric layer 190, for example, corresponds to upper ILD levels. The dielectric layer 190, for example, is a dielectric stack having one or more dielectric layers. The dielectric layer 190 includes low-k dielectric material, such as SiCOH. Other suitable configurations and materials for the dielectric layer may also be useful.

The dielectric layer 190 includes a plurality of dual damascene interconnect in the first and second regions. For example, the dielectric layer 190 includes via contacts 187 coupled to metal lines 189 in the logic region 110a and the memory region 110b. The metal lines 189 are disposed in the metal levels while the via contacts 187 are disposed in the via levels of the dielectric layer 190. For simplicity, the via and metal levels of the dielectric layer 190 may be referred to as upper interconnect levels. Although one or two metal lines and via contacts are shown for the first and second regions in each metal and via levels of the dielectric layer, it is understood that there could be other suitable number of metal lines and via contacts in the same metal level and via level of the first and second regions.

The top most via contacts and the top most metal lines in the dielectric layer 190, for example, may be referred to as the top via contacts and top metal lines. The top most via contacts and metal lines may have different design rules than the via contacts and metal lines of lower ILD levels. By way of example only, and without limitation, the dimensions of the top metal lines and the top via contacts are defined at twice the minimum line resolution of the lithography and etch capability for a technology process node, which may be referred to as 2× design rule. For example, the thickness of the top metal lines, for example, may be at least 2 times greater than the thickness of the metal lines below. It is understood that other suitable design rules may be applicable. The via contacts 187 and metal lines 189 in the dielectric layer 190 include a conductive material, such as Cu. Other suitable configurations and conductive materials for the via contacts and metal lines may also be useful.

A pad level (not shown) is disposed over the uppermost ILD level. For example, a pad dielectric level is disposed over Mx. In the case where the device includes 4 metal levels, the pad level is disposed over M4. The pad dielectric layer, for example, may be silicon oxide. Other types of dielectric materials may also be useful. The pad dielectric layer includes conductive pads, such as bond pads or pad interconnects for providing external interconnections to the components. Bond pads may be used for wire bonding while pad interconnects may be provided for contact bumps. The external interconnections may be input/output (I/O), power and ground connections to the device. The pads, for example, may be aluminum pads. Other types of conductive pads may also be useful. A passivation layer, such as silicon oxide, silicon nitride or a combination thereof, may be provided over the pad level. The passivation layer includes openings to expose the pads.

FIGS. 5a-5m show simplified cross-sectional views of a process 500 for forming an embodiment of a device. The cross-sectional views of the process 500 are taken along first (or logic) region 110a, second (or memory) region 110b and third (or scribe) region 110c of the device. In one embodiment, the process allows a memory cell to be formed with logic components on the same substrate sing logic processing. The process 500 which forms the memory cell together with the logic components are generally based on any suitable technology node (including but not limited to 20 nm technology node and below). The memory cell, for example, may be a MRAM cell. The MRAM cell, in one embodiment, is a STT-MRAM cell. The device formed, for example, is similar or the same as that shown and described in FIGS. 4a-4b. As such, common elements may not be described or described in detail.

For simplicity, the processing of a substrate to form transistors using FEOL processing is not shown. For example, the processing of the substrate to form isolation regions, gates, first and second S/D regions of the transistors in the first and second regions is not shown. Referring to FIG. 5a, the process 500 is at the stage of providing a first dielectric layer 120 over a substrate (not shown) covering the logic transistors and select transistors (not shown) in the first and second regions. The dielectric layer 120, for example, may correspond to pre-metal dielectric (PMD) or CA level. For the sake of simplicity and for illustration purpose, the dielectric layer 120 may be referred to as CA dielectric layer. The dielectric layer 120 is formed of a dielectric material, such as TEOS, and is formed by chemical vapor deposition (CVD). Other suitable dielectric materials and forming techniques may also be useful. The thickness of the CA dielectric layer, for example, is about 180 nm. Other suitable thickness dimensions may also be useful.

The process includes forming suitable number of via openings 531 in the first (or logic) region 110a and second (or memory) region 110b. The via openings, for example, are formed for accommodating contact plugs which are electrically connected to contact regions (e.g., gates and S/D regions) of the transistors in the first and second regions. To form the via openings, a photoresist (not shown) is applied to the top surface 120a of the CA dielectric layer to define a pattern arrangement for fabricating the via openings 531. Portions of the CA dielectric layer not protected by the photoresist are removed (e.g., by using an etch process) to form the via openings, exposing the contact regions below. The etch process, for example, may be an anisotropic etch, such as RIE. Other suitable removal process may also be employed.

Figure 5B:
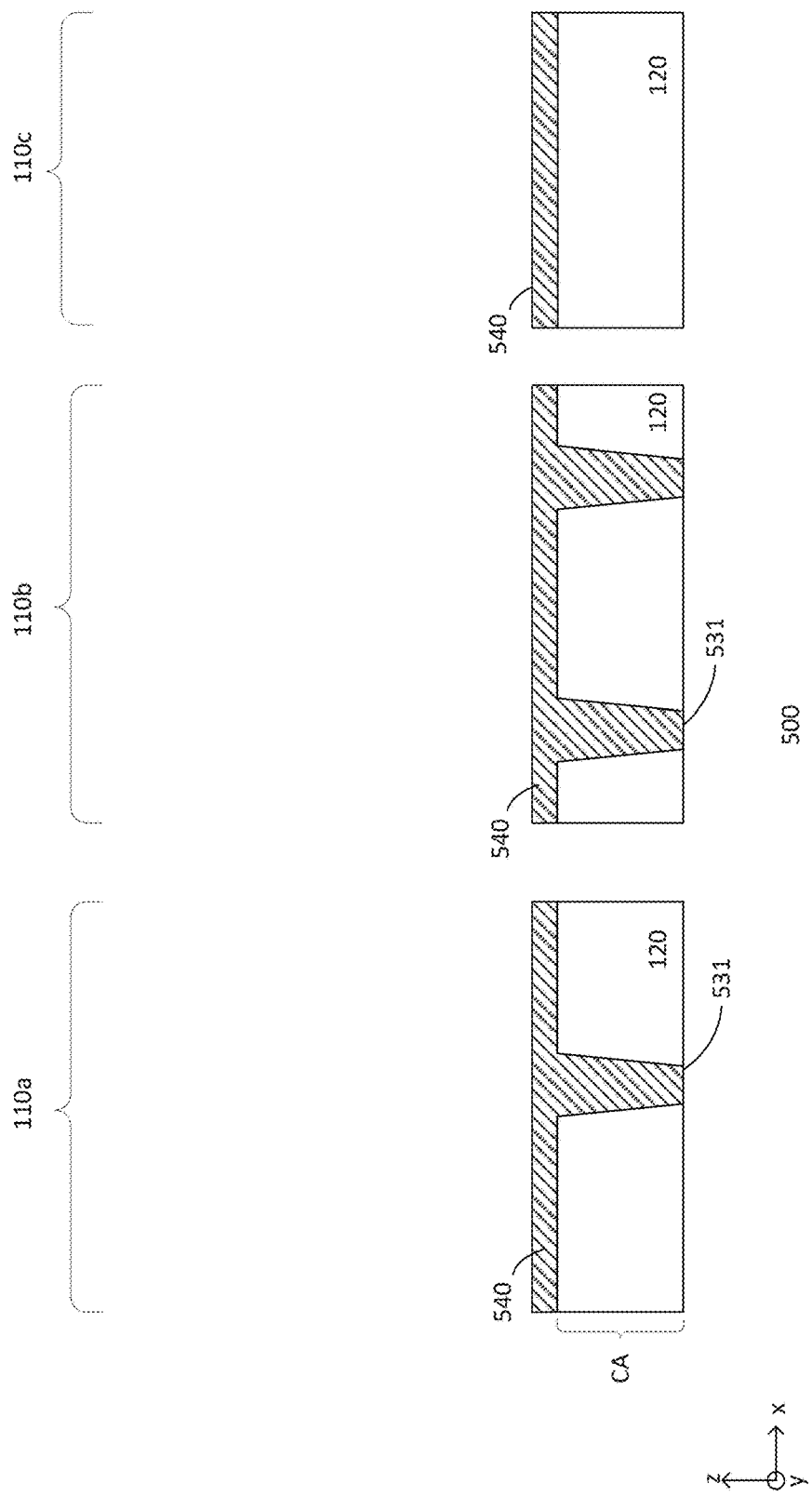

Referring to FIG. 5b, contact plugs 131 are formed in the via openings 531. For example, the openings are filled with a conductive material 540, such as tungsten. Other suitable types of conductive materials may also be useful. Excess material is removed by, for example, chemical mechanical polishing (CMP). In one embodiment, the CMP process forms contact plugs 131 that partially fill the via openings while leaving recesses 533 over a top portion of the via openings as shown in FIG. 5c. For example, the CMP process may be configured to remove excess conductive material over the top surface 120a of the CA dielectric layer and further removes a portion of the conductive material in the via openings, leaving a recess 533 over the contact plugs. For example, the recesses 533 can be formed by adjusting the polish selectivity of the materials of the dielectric layer 120 (e.g., TEOS) and contact plugs (e.g., tungsten) and the polishing time. Other suitable techniques for forming the recesses may also be useful. As shown, the contact plugs 131 are defined to have a top surface that is below the top surface 120a of the CA dielectric layer. The recess 533 formed, for example, includes sufficient depth to accommodate a bottom electrode as will be described later. The recess, for example, is about 20 nm deep with respect to the top surface 120a of the dielectric layer. Other suitable depth dimensions may also be useful.

Figure 5E:
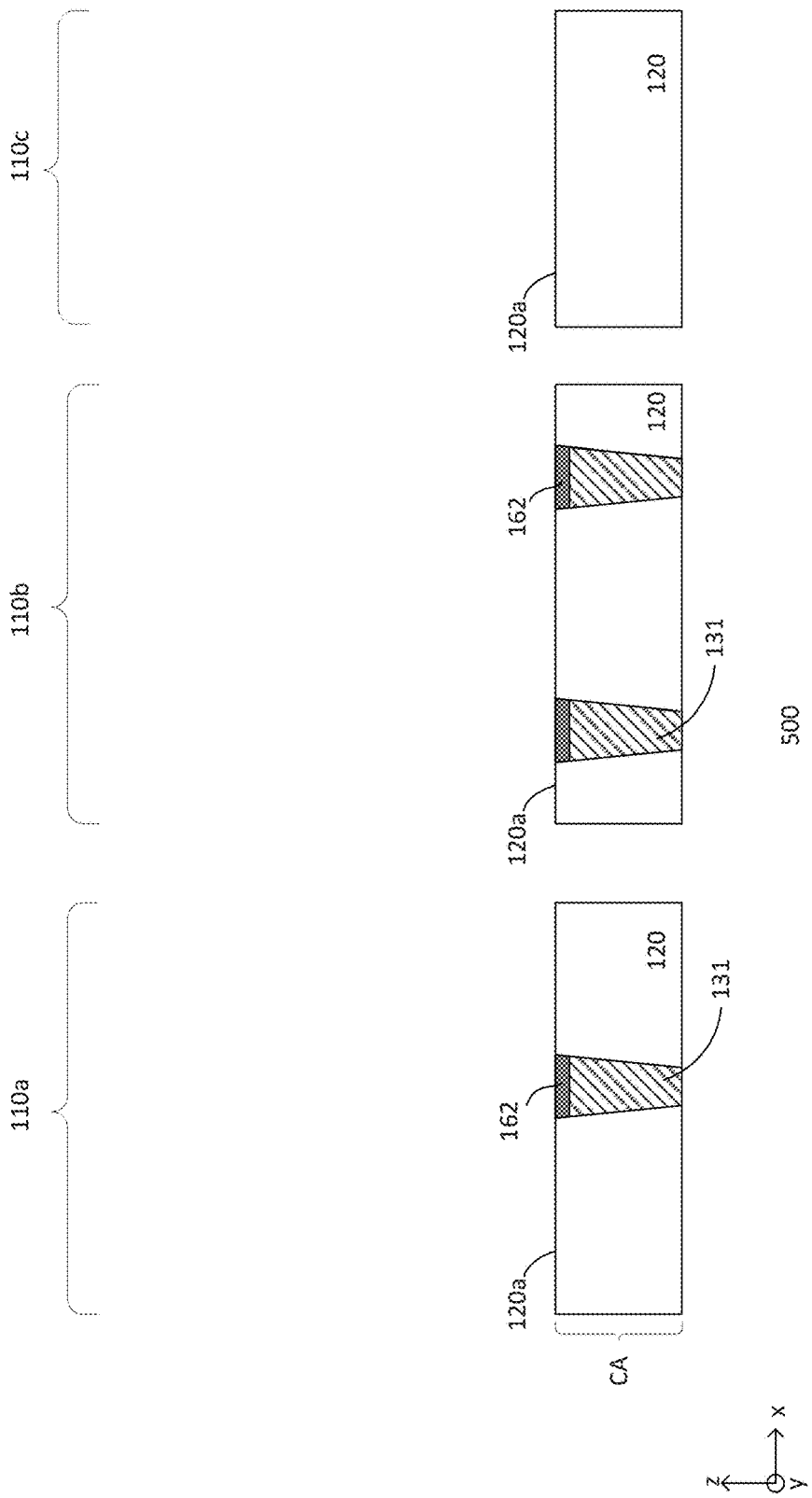

Referring to FIG. 5d, the process continues by depositing a conductive layer 562 over the first, second and third regions on top of the CA dielectric layer and fills the recesses 533 in the first and second regions. The conductive layer, for example, may be formed by physical vapor deposition (PVD). The conductive layer, for example, may be Ti, TiN, Ta, TaN or other suitable metals used in the semiconductor process. Other suitable conductive materials and deposition techniques may also be employed. A planarization process, such as CMP, is performed to remove excess conductive material on top of the CA dielectric layer and to provide a substantially planar surface. As shown, the recesses in the first and second regions are filled with the conductive material. Thus, the CMP process defines the bottom electrode 162 in the first and second regions having a top surface which is substantially planar with the top surface of the CA dielectric layer as shown in FIG. 5e. The bottom electrode 162 in the first region may be coupled to a via contact in an upper ILD level while the bottom electrode 162 in the second region may be coupled to a MTJ element which will be formed and described later. As shown, the conductive layer is completely removed from the third region.

In FIG. 5f, the CA dielectric layer 120 in the third (or scribe) region 110c is patterned to form trench openings 535. In one embodiment, the openings 535 in the third region includes sufficient depth to serve as an alignment trench which provides adequate topography which is used for aligning and defining subsequently formed layers of the MTJ element of the MRAM cells in the second region. The alignment trench, for example, may include a plurality of groups and subgroup of alignment trenches. The trenches may be rectangular or square shape or may include other suitable shapes. The trenches may be formed by mask and etch techniques. For example, a patterned photoresist mask may be formed over the CA dielectric layer, serving as an etch mask. An etch, such as RIE, may be performed to pattern the CA dielectric layer using the patterned resist etch mask. In one embodiment, the etch transfers the pattern of the mask to the CA dielectric layer to remove exposed portions of the CA dielectric layer not covered by the etch mask. As shown, the etch forms the alignment trench which has a depth sufficiently deep to provide a topographic feature during processing of the various MTJ layers of the MTJ stack later. The alignment trench, for example, may be about 30-100 nm deep from the top surface of the CA dielectric layer. Other suitable depth dimensions may also be useful.

The process continues to form MTJ stack of the MRAM cell. Various layers of the MTJ stack are formed on the CA dielectric layer 120. For example, various layers of the MTJ stack of the MRAM cell are sequentially formed over the CA dielectric layer in the first, second and third regions. The process forms various layers of the MTJ stack over the CA dielectric layer 120 by PVD process. The various layers of the MTJ stack are conformally formed over the first and second regions and line the alignment trench in the third region. Other suitable techniques may also be used. For simplicity and illustration purpose, the MTJ stack, for example, is shown to include four layers having materials the same as that described in FIGS. 4a-4b. It is understood that the MTJ stack may include other suitable number of layers and other suitable materials. In some embodiments, a top electrode layer may also be formed over the various layers of the MTJ stack.

The process continues to pattern various layers of the MTJ stack as shown in FIG. 5g. Patterning the layers may be achieved with mask and etch techniques. A soft mask (not shown), such as a photoresist layer, is formed on the MTJ layers. The soft mask is patterned to form a pattern which is used to define the MTJ elements. To form the pattern in the mask layer, it may be selectively exposed with an exposure source using a reticle (not shown) such as that shown in FIG. 3. In one embodiment, the reticle (not shown) used to expose the resist mask is aligned using the alignment mark 135 in the third region, which is visible as topography when viewed from top. The pattern of the reticle is transferred to the resist layer after exposure by a development process.

The patterned resist mask is used define the MTJ stack 164 of the magnetic storage element of the MRAM cell by removing portions of the layers of the MTJ stack not protected by the patterned mask in the first, second and third regions. In one embodiment, the layers of the MTJ stack are patterned in such a way that the MTJ stacks are aligned and properly coupled to the bottom electrodes 162 in the second region using the topography 135 which is present in the alignment trench. The profile of the alignment trench creates adequate topography feature 135 in the third region which is visible from the top surface of the substrate. The topography feature may be used as an alignment mark during patterning to define layers of MTJ stack of the MRAM cell such that the patterned MTJ stack is properly coupled to the underlying bottom electrode 162. Other suitable techniques for patterning the layers and to ensure that the MTJ stack align and properly couple to the underlying bottom electrode 162 in the second region may also be useful.

As shown in FIG. 5g, the layers of the MTJ stack are completely removed from the first region while horizontal portions of the layers of the MTJ stack are removed from the third region. Other suitable techniques for patterning the layers of the MTJ stack may also be useful. For simplicity and for illustration purpose, the MTJ slack 164 is defined as having straight sidewall profile. In some examples, the MTJ stack may be defined such that upper layers of the MTJ stack include a dimension smaller than lower layers of the MTJ stack as described in FIGS. 4a-4b. A description of the techniques used for forming such MTJ stack is provided in, for example, co-pending U.S. patent application Ser. No. 15/063,544, filed on Mar. 8, 2016, entitled "INTEGRATED MAGNETIC RANDOM ACCESS MEMORY WITH LOGIC DEVICE HAVING LOW-K INTERCONNECTS", which is herein incorporated by reference for all purposes.

The process continues by depositing a dielectric liner or encapsulation liner 182 over the first, second and third regions as shown in FIG. 5g. The dielectric liner 182 covers exposed top and side surfaces of the patterned MTJ layers in the second region while covering top surface of the CA dielectric layer in the first and third regions. The dielectric liner 182, for example, may be formed by CVD and serves as an etch stop layer or protective layer during subsequent processing. The dielectric liner may be a low k dielectric liner. For example, the dielectric liner may be nBLOK. Other suitable types of dielectric materials for the dielectric liner and forming techniques may also be useful.

A second dielectric layer 122 is formed over the CA dielectric layer 120 in the first, second and third regions. The second dielectric layer 122 is formed over the encapsulation liner 182 in the first, second and third regions as shown in FIG. 5h. The second dielectric layer, for example, includes a low-k dielectric material, such as SiCOH. Other suitable low-k dielectric materials may also be useful. The second dielectric layer may be formed by CVD and includes a thickness sufficient to cover the patterned MTJ stack 164 in the second region. Other suitable dielectric materials and techniques may be used for forming the second dielectric layer. A planarization process is performed to remove excess second dielectric layer. The planarization process, for example, may be achieved by CMP. Other suitable techniques may also be useful. The planarization process produces a substantially planar top surface. As shown, the planarization process removes a top portion of the encapsulation liner 182 until the top most layer of the MTJ stack is exposed in the second region as shown in FIG. 5h. The planarized second dielectric layer 122, for example, surrounds and covers the sides of the MTJ stack 164 in the second region.

Figure 5K:
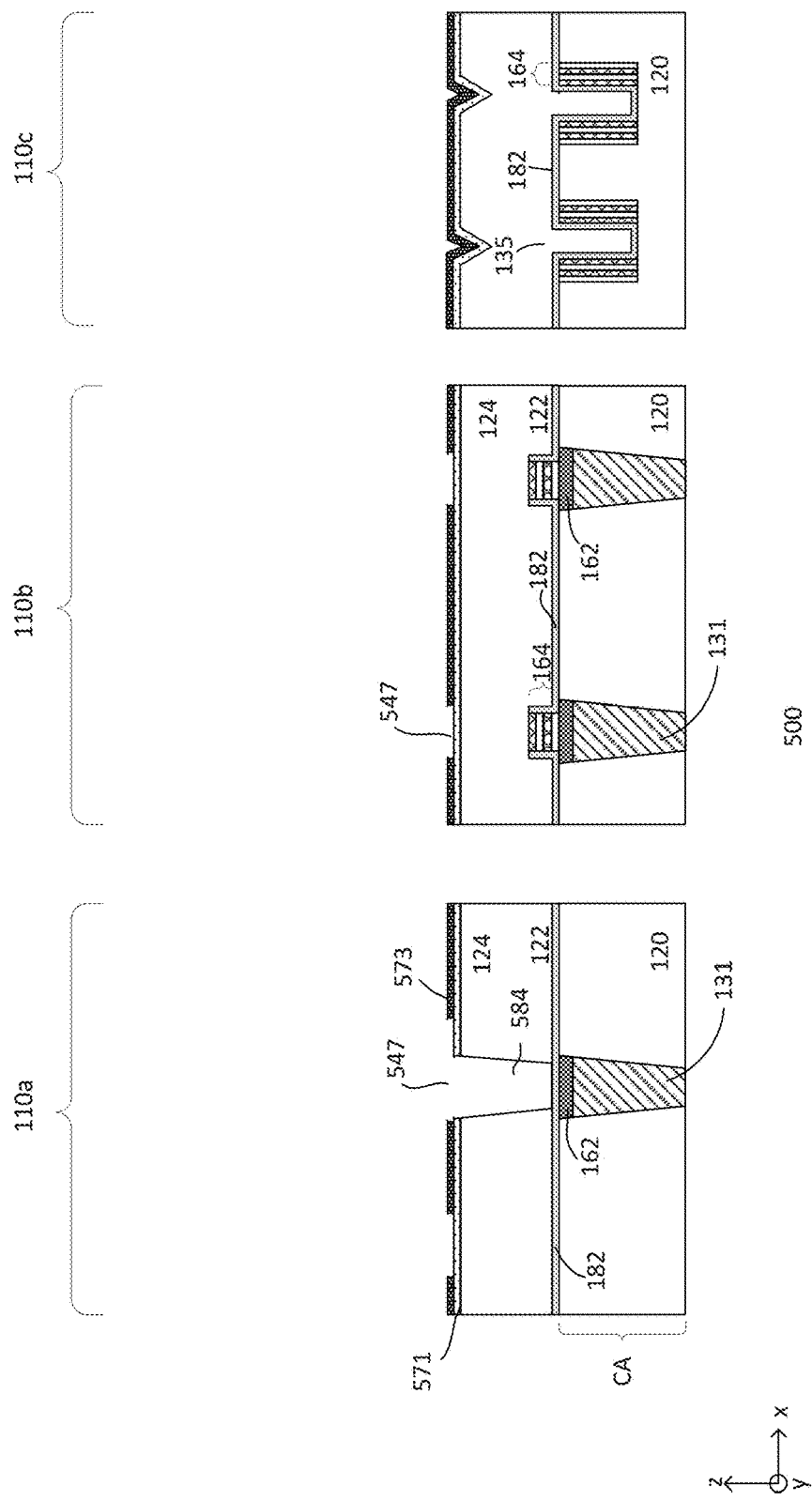
Figure 5I:
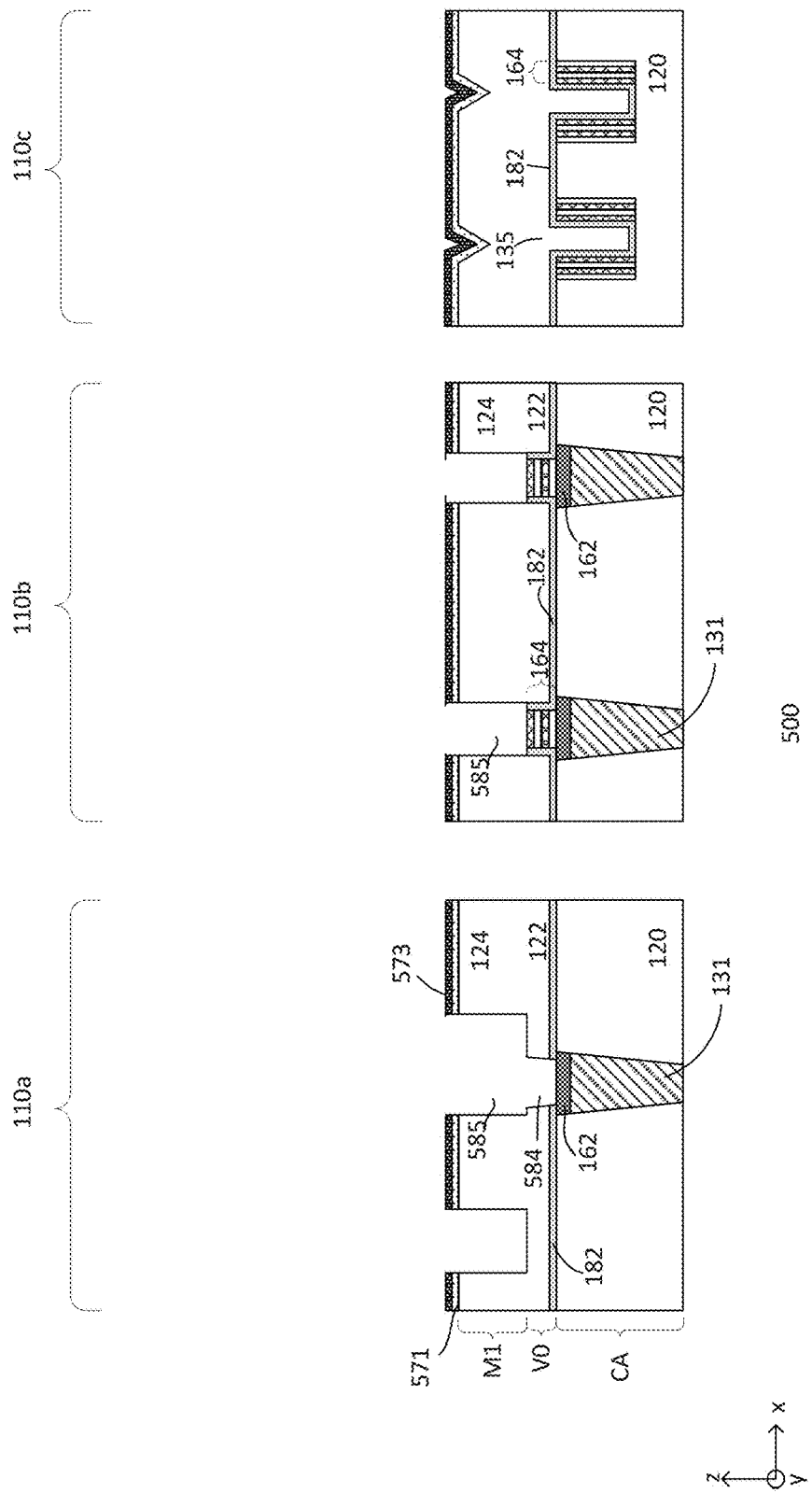

As shown in FIG. 5i, the process continues to form a third dielectric layer 124 in the first, second and third regions. The third dielectric layer, for example, includes a low-k dielectric material which is the same material as the second dielectric layer. The third dielectric layer may be formed by CVD and includes a thickness sufficient to cover the MTJ elements in the second region. Other suitable dielectric materials and techniques may be used for forming the third dielectric layer. As shown, the third dielectric layer follows the topography of the alignment trench in the third region.

The process continues to form a hard mask layer. In one embodiment, the hard mask layer includes a hard mask stack. For example, the hard mask stack includes first and second hard mask layers 571 and 573. Other suitable number of hard mask layers may also be useful. In one embodiment, the first and second hard mask layers are sequentially formed over the third dielectric layer using CVD process. The first hard mask layer 571, for example, may be an oxide hard mask while the second hard mask layer 573 formed over the first hard mask layer may be a metal hard mask. For example, the oxide hard mask may be a TEOS hard mask while the metal hard mask may be a TiN hard mask. Other suitable types of hard mask materials and forming techniques may also be useful. In some other embodiments, the hard mask layer may be a single hard mask layer. The number of hard mask layers used, for example, may depend on the process used for the technology node.

In one embodiment, the process continues to form dual damascene openings having a trench and a via opening in the second and third dielectric layers 122 and 124 in the first region and a damascene opening having a trench in the second region. The dual damascene opening may be formed by via first or via last process. By way of example, a first removal process may be performed using suitable mask and etch technique to define trench openings 547 in the second hard mask layer 573. The trench openings 547, for example, correspond to metal lines of M1 level it the third dielectric layer. The first removal process, for example, removes exposed portions of the second hard mask layer not protected by a mask (not shown). The first removal process, includes an etch process highly selective to the material of the second hard mask layer. The etch process stops when it reaches a top surface of the first hard mask layer avoid etching into the third dielectric layer 124 as shown in FIG. 5j.

The process 500 continues by forming one or more via openings 584 in the first region. A second removal process may be performed using suitable mask and etch technique to form one or more via openings 584 in the first region. The via opening, for example, corresponds to via contact in V0 level in the second dielectric layer 122. The second removal process, for example, may employ an etch which has high selectivity between the materials of the dielectric layer and the dielectric liner 182 to remove exposed portions of the dielectric layer to form the via opening while the second and third regions are covered by a mask (not shown). As shown in FIG. 5k, the etch forms the via opening 584 in the first region and stops when it reaches the top surface of the dielectric liner 182.

The process continues to form trenches 585 in the first and second regions. The trenches, for example, include the same depth dimension defined by, for example, 1× design rule. The depth of the trenches, for example, is about 700 Å with reference to the top surface of the third dielectric layer based on, for example, 20 nm technology node. Other suitable depth dimensions may also be useful, depending on design requirement of a technology node.

A third removal process may be performed using suitable etch technique to form the trenches in the first and second regions. In one embodiment, the trenches in the first and second regions are formed by the same etch process. The trenches, in one embodiment correspond to metal lines of M1. The etch, for example, includes a blanket etch which removes exposed portions of the dielectric layer 124 and dielectric liner 182. As shown, the trenches 585 are defined by the openings in the pre-patterned hard mask 573. The trench 585 in the first region is in communication with the bottom electrode 162 which is in communication with the contact plug 131 coupled to first S/D region of the logic transistor while the trench 585 in the second region is in communication with the top surface of the MTJ element 164 as shown in FIG. 5l. Preferably, the critical dimension (CD) of the trench in the second region, for example, is smaller than the CD of the MTJ stack with encapsulation liner. The hard mask layer may be removed thereafter using suitable techniques.

A conductive layer is formed. The conductive layer covers the third dielectric layer 124 as well as filling the trenches and via opening. For example, the conductive layer fills both the trenches in the first and second regions and the via opening in the first region. The conductive layer should be sufficiently thick to fill the trenches and via opening. The conductive layer, for example, includes copper. Other suitable conductive materials may also be useful. Excess conductive material is removed by CMP, forming metal lines 185 and via contact 184 in the first region as well as metal lines 185 in the second region as shown in FIG. 5m. As shown, the top surface of the metal lines is substantially planar with the top surface of the third dielectric layer 124. The metal line and via contact in the first region are formed by dual damascene process.

A dielectric liner 186 may be formed over the top surface of the third dielectric layer 124, covering the metal lines 185. The dielectric liner 186, for example, may include the same material and formed by the same technique as the encapsulation liner 182 as described above. Other suitable dielectric materials and forming techniques may also be useful.

The process 500, for example, continues to form dielectric layer 190 having upper interconnect levels and to complete formation of the IC. The process, for example, may continue to form a plurality of dielectric layers and to form upper interconnects having metal lines and via contacts in upper interconnect level. Passivation layer and pad interconnects or bonding pads may be formed after defining the upper interconnect level. Further processing can include final passivation, dicing, assembly and packaging. Other processes are also useful.

As shown, the device includes two memory cells. However, it is understood that a device may include numerous memory cells integrated into the same IC. Although as described, the bitline is disposed in specified ILD level of the back end dielectric layer, other configurations may also be useful. For example, the bitline may be disposed in other suitable ILD level.

The embodiments as described in the present disclosure result in various advantages. The process as described is highly compatible with logic processing or technology. For example, magnetic storage element of the memory cell is formed in between CA and M1 level of the BEOL dielectric layers and is concurrently formed on the same substrate using logic processing without compromising the reliabilities of the memory cell and other components in the logic region on the same substrate. Moreover, the process as described is useful for integrating MRAM cell with logic components in low-k dielectric layers with minimal masks. The process as described can save the cost of several masks compared to conventional process. For example, the process as described eliminates the use of masks for defining bottom electrode (BE) and top electrode (TE) of the storage element as the bottom electrode is formed in the recess over the contact plug and top electrode may not be formed over the MTJ stack. The process as described avoids investment of new tools and reduces the number of masks involved for integrating MRAM components with logic components.

Furthermore, the process allows for more compact MRAM cell to be formed as the bottom electrode may be embedded within the via openings which are used for accommodating contact plug of the CA level and is in direct contact with the contact plugs. Additionally, the bottom electrode which uses TaN material offers a substantially flat and smooth surface for MTJ landing relative to where MTJ elements were to be coupled directly to the contact plug in CA level. Moreover, the insertion of the storage or MTJ elements in between CA and M1 levels provides high flexibility to to designers to select back end of line (BEOL) build as CA and M1 are common components for all BEOL builds.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
a substrate defined with at least first and second regions, wherein the first region comprises a logic region and the second region comprises a memory region;
a first dielectric layer over the substrate, the first dielectric layer serves as a lower via level;
first and second lower via plugs in first and second lower vias in the first dielectric layer;
a second bottom electrode disposed on top of the second lower via plug in the second region, wherein the second bottom electrode is disposed in the second lower via and is coplanar with a top surface of the first dielectric layer;
a magnetic random access memory (MRAM) element comprising MTJ layers in the second region, wherein the MRAM element contacts the second bottom electrode; and
a second dielectric layer disposed on the first dielectric layer, covering the MRAM element, wherein the second dielectric layer comprises an upper via level and a metal level, the second dielectric layer includes a via contact in the upper via level and a metal line in the metal level in the first region and an upper MRAM element contact in the upper via level and the metal level in the second region, the upper MRAM element contact is electrically coupled to the MRAM element.

2. The device of claim 1 wherein
the lower via level and the upper via level serve as the first contact level which is a lowest via level of the device; and
the metal level serves as the first metal level (M1) which is a lowest metal level of the device.

3. The device of claim 1 comprises
an alignment trench in the first dielectric layer in a third region of the substrate; and
wherein,
the MTJ layers lines sidewalls of the alignment trench, and
the second dielectric layer fills the alignment trench.

4. The device of claim 3 wherein the third region is disposed in a scribe region of the substrate.

5. The device of claim 3 wherein a bottom of the alignment trench between the MTJ layers lining sidewalls of the alignment trench is exposed.

6. The device of claim 5 wherein the third region is disposed in a scribe region of the substrate.

7. The device of claim 1 wherein the second bottom electrode comprises a bottom electrode of the MRAM element.

8. The device of claim 1 comprises a first bottom electrode on top of the first lower via plug, wherein the first bottom electrode is disposed in the first lower via and is coplanar with a top surface of the first dielectric layer.

9. The device of claim 8 wherein the first and second bottom electrode comprises a same material, and wherein the second bottom electrode serves as a bottom electrode of the MRAM element.

10. A device comprising:
at least first, second and third regions, wherein the first region comprises a logic region and the second region comprises a memory region;
a first dielectric layer disposed over the first, second and third regions, the first dielectric layer serves as a lower via level, the first dielectric layer includes first and second lower via plugs in first and second lower vias in the first and second regions and an alignment marker trench in the third region;
a magnetic random access memory (MRAM) element comprising MTJ layers in the second region of the device, wherein the MRAM element contacts the second lower via plug in the second region and the MTJ layers lining sidewalls of the alignment marker trench, wherein the alignment marker trench comprises sidewalls lined with the MTJ layers while a bottom of the alignment marker trench between the MTJ layers is exposed;
a second dielectric layer disposed over the first dielectric layer, the second dielectric layer covers the MRAM element and fills the alignment marker trench lined with the MTJ layers, wherein the second dielectric layer includes an upper via level and a metal level; and
a via contact and a metal line disposed in the first region of the second dielectric layer and an upper MRAM element contact is disposed in the second region of the second dielectric layer.

11. The device of claim 10 wherein the third region is disposed in a scribe region.

12. The device of claim 10 wherein the second lower via plug comprises a second bottom electrode disposed on top of the second lower via plug, the second bottom electrode is disposed within the second lower via and a top surface of the second bottom electrode is coplanar with a top surface of the first dielectric layer.

13. The device of claim 12 wherein the second bottom electrode serves as a bottom electrode of the MRAM element.

14. The device of claim 12 comprises a first bottom electrode disposed on top of the first lower via plug, the first bottom electrode is disposed within the first lower via and a top surface of the first bottom electrode is coplanar with a top surface of the first dielectric layer.

15. A device comprising:
a substrate defined with at least first and second regions, wherein the first region comprises a logic region and the second region comprises a memory region;
a first dielectric layer over the substrate, the first dielectric layer serves as a lower via level of a first contact level of the device;
first and second lower via plugs in first and second lower vias in the first dielectric layer;
a magnetic random access memory (MRAM) element comprising MTJ layers in the second region, wherein the MRAM element contacts the second lower via plug in the second region, wherein the second lower via plug comprises a second bottom electrode disposed on top of the second lower via plug, the second bottom electrode is disposed within the second lower via and a top surface of the second bottom electrode is coplanar with a top surface of the first dielectric layer; and
a second dielectric layer disposed on the first dielectric layer, covering the MRAM element, wherein the second dielectric layer comprises an upper via level and a metal level, the second dielectric layer includes a via contact in the upper via level and a metal line in the metal level in the first region and an upper MRAM element contact in the upper via level and the metal level in the second region, the upper MRAM element contact is electrically coupled to the MRAM element, the upper via level serves as the upper via level of the first contact level of the device and the metal level serves as a first metal level of the device which is a lowest metal level of the device.

16. The device of claim 15 wherein the second bottom electrode serves as a bottom electrode of the MRAM element.

17. The device of claim 15 comprises:
an alignment trench in the first dielectric layer in a third region of the substrate; and
wherein,
the MTJ layers lines sidewalls of the alignment trench, and
the second dielectric layer fills the alignment trench.

18. The device of claim 17 wherein a bottom of the alignment trench between the MTJ layers lining sidewalls of the alignment trench is exposed.

* * * * *